United States Patent
Ogasawara et al.

(10) Patent No.: US 12,021,513 B2
(45) Date of Patent: Jun. 25, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yosuke Ogasawara, Kawasaki Kanagawa (JP); Takayuki Teraguchi, Kawasaki Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 17/939,873

(22) Filed: Sep. 7, 2022

(65) Prior Publication Data

US 2023/0170894 A1  Jun. 1, 2023

(30) Foreign Application Priority Data

Nov. 29, 2021 (JP) .................. 2021-193171
Jun. 28, 2022 (JP) .................. 2022-103787

(51) Int. Cl.
*H03K 17/10* (2006.01)
*H03K 17/16* (2006.01)
*H03K 17/687* (2006.01)
*H03K 17/693* (2006.01)

(52) U.S. Cl.
CPC ......... *H03K 17/102* (2013.01); *H03K 17/162* (2013.01); *H03K 17/6871* (2013.01); *H03K 17/693* (2013.01)

(58) Field of Classification Search
CPC ............. H03K 17/102; H03K 17/162; H03K 17/6871; H03K 17/693; H03K 17/735; H04B 1/44; H04B 1/40; H04B 1/38
See application file for complete search history.

(56) References Cited

U.S. PATENT DOCUMENTS

| | | | |
|---|---|---|---|
| 9,160,328 B2 | 10/2015 | Altunkilic et al. | |
| 10,715,133 B1 | 7/2020 | Scott et al. | |
| 10,998,900 B2 | 5/2021 | Scott et al. | |
| 2012/0153396 A1 | 6/2012 | Sugiura et al. | |
| 2023/0318597 A1* | 10/2023 | Jo .................. | H03K 17/063 327/108 |

FOREIGN PATENT DOCUMENTS

| | | |
|---|---|---|
| JP | 2012-134317 A | 7/2012 |
| JP | 5714886 B2 | 5/2015 |
| JP | 6026654 | 11/2016 |

* cited by examiner

*Primary Examiner* — Jung Kim
(74) *Attorney, Agent, or Firm* — Kim & Stewart LLP

(57) ABSTRACT

A semiconductor device includes an input terminal, an output terminal, and a plurality of transistors. The transistors are coupled through serial coupling. The transistors include a first transistor and a second transistor. The first transistor has a first end and a second end. The second transistor has a third end, a fourth end, a first gate, and a first body. The third end is coupled to the second end. The semiconductor device further includes a third transistor and a first diode. The third transistor and the first diode are serially coupled between the first body and the first end. The third transistor includes a second gate coupled to the first gate.

14 Claims, 15 Drawing Sheets

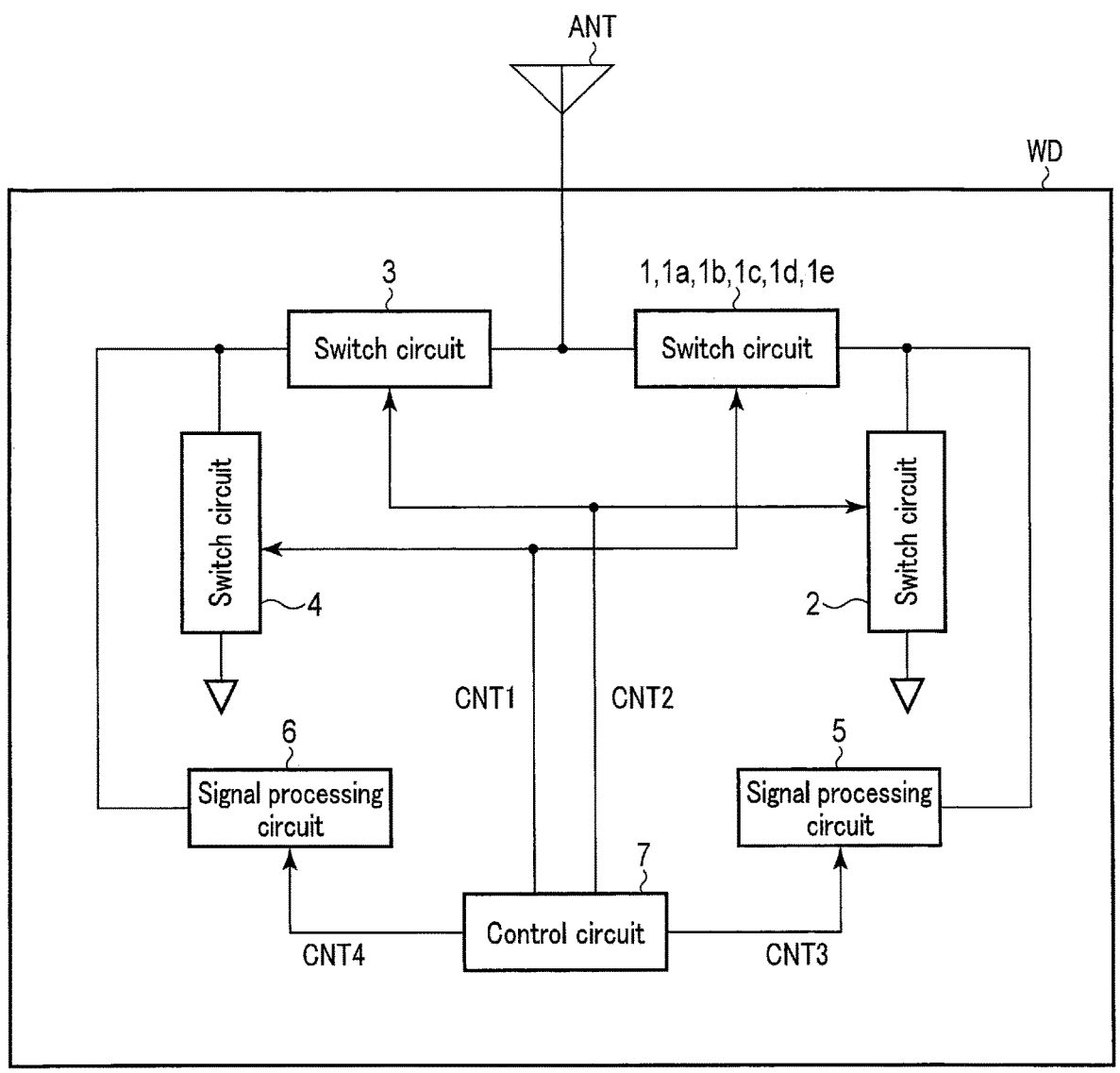
F I G. 1

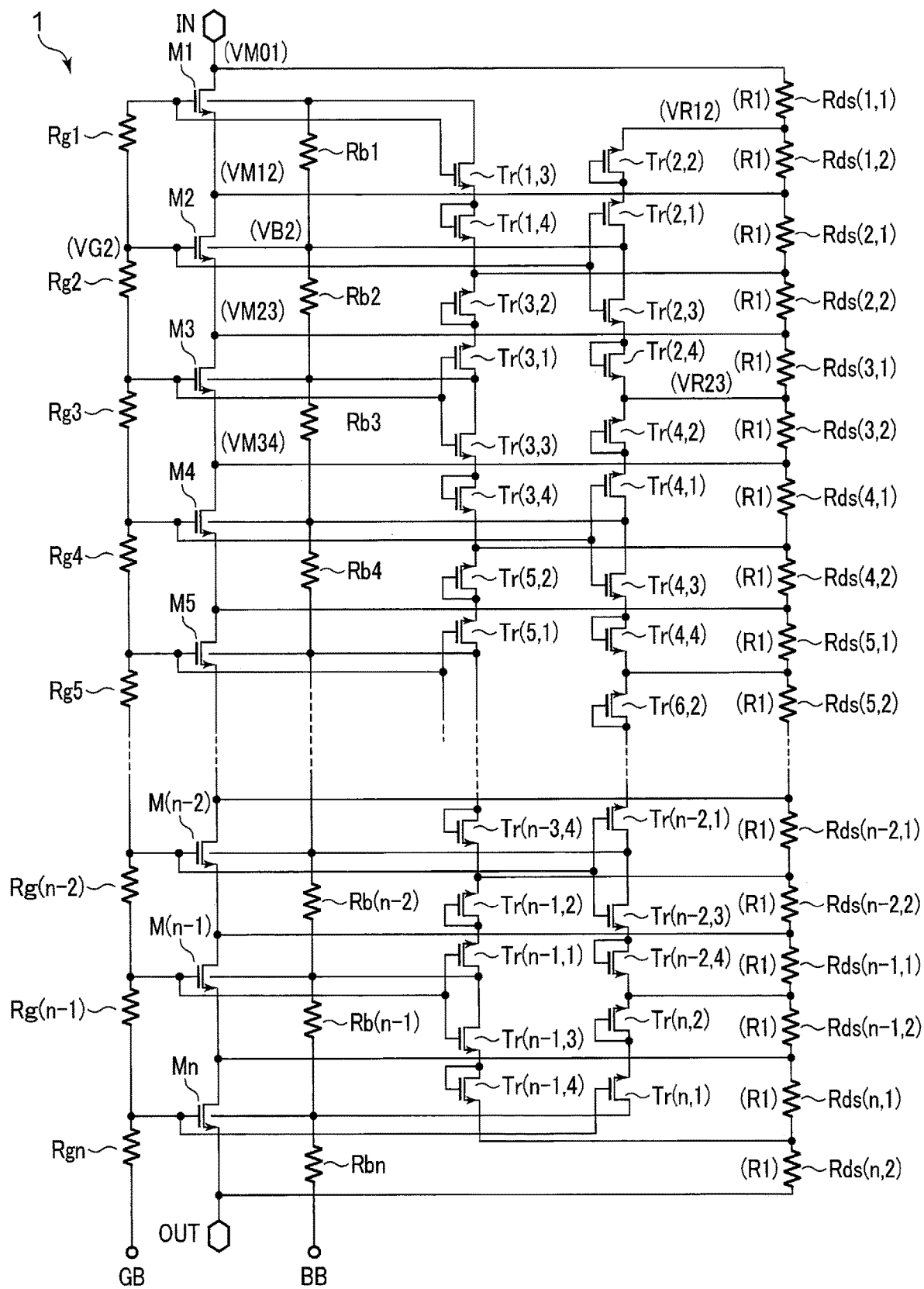
F I G. 2

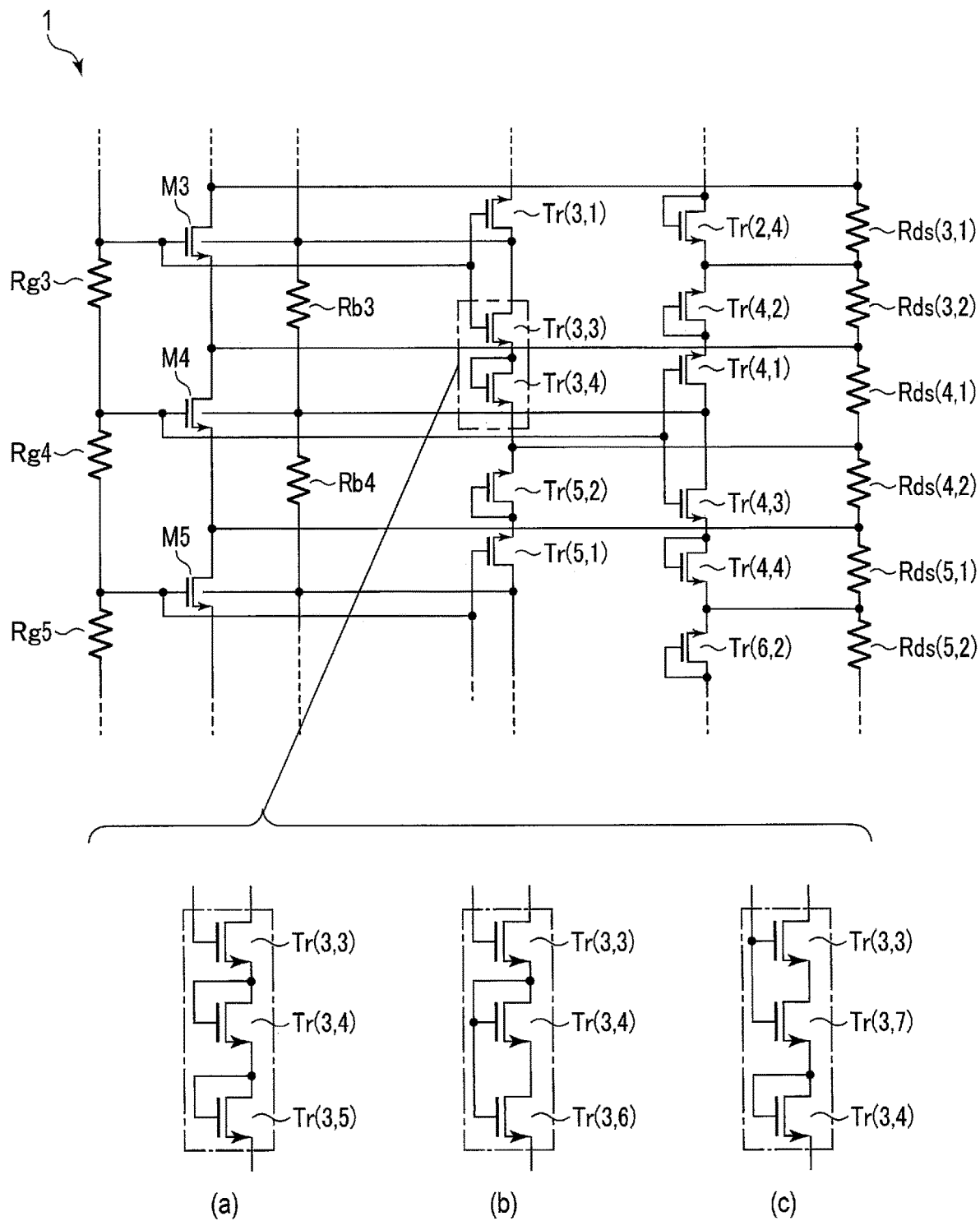
F I G. 10

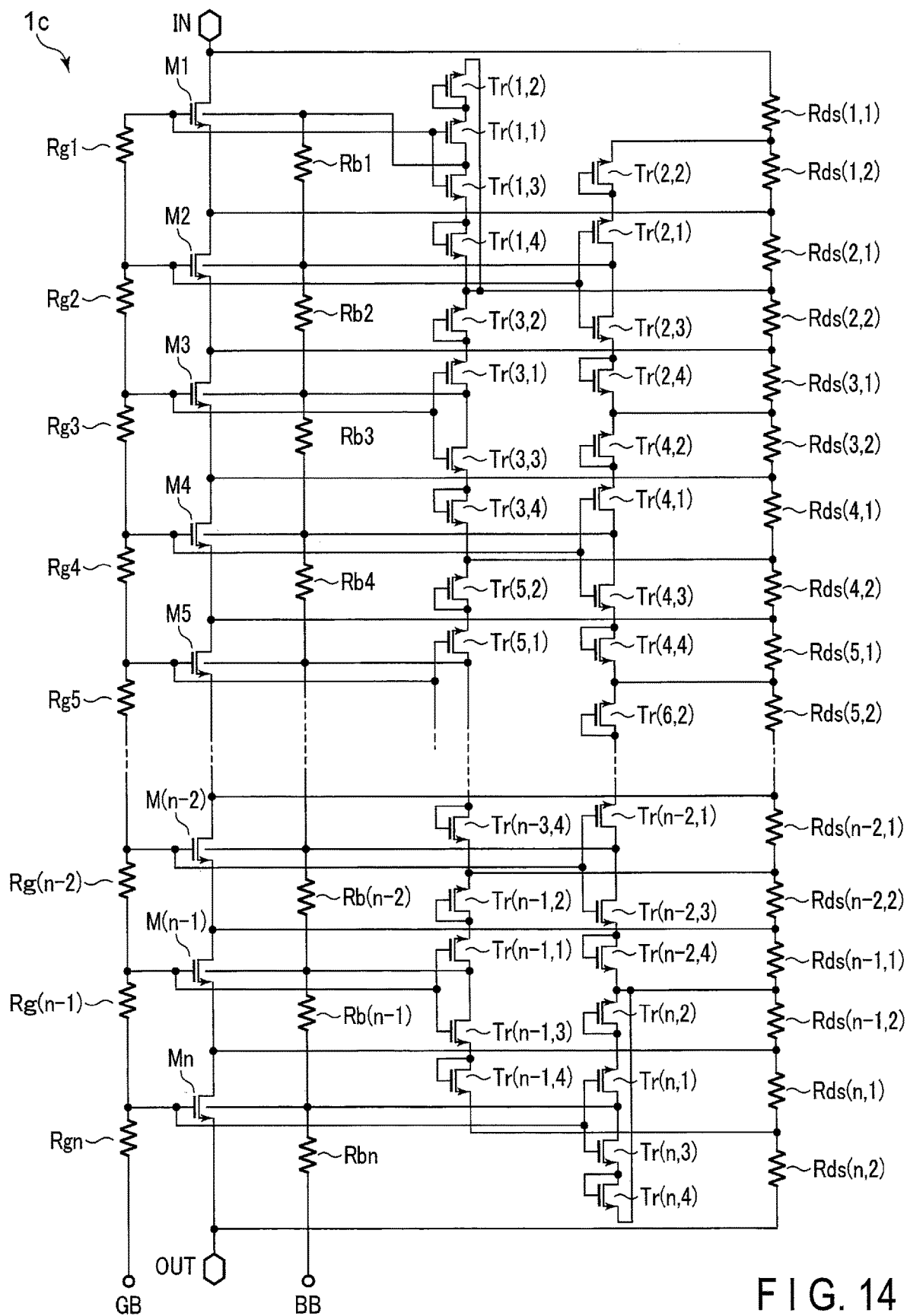
F I G. 14

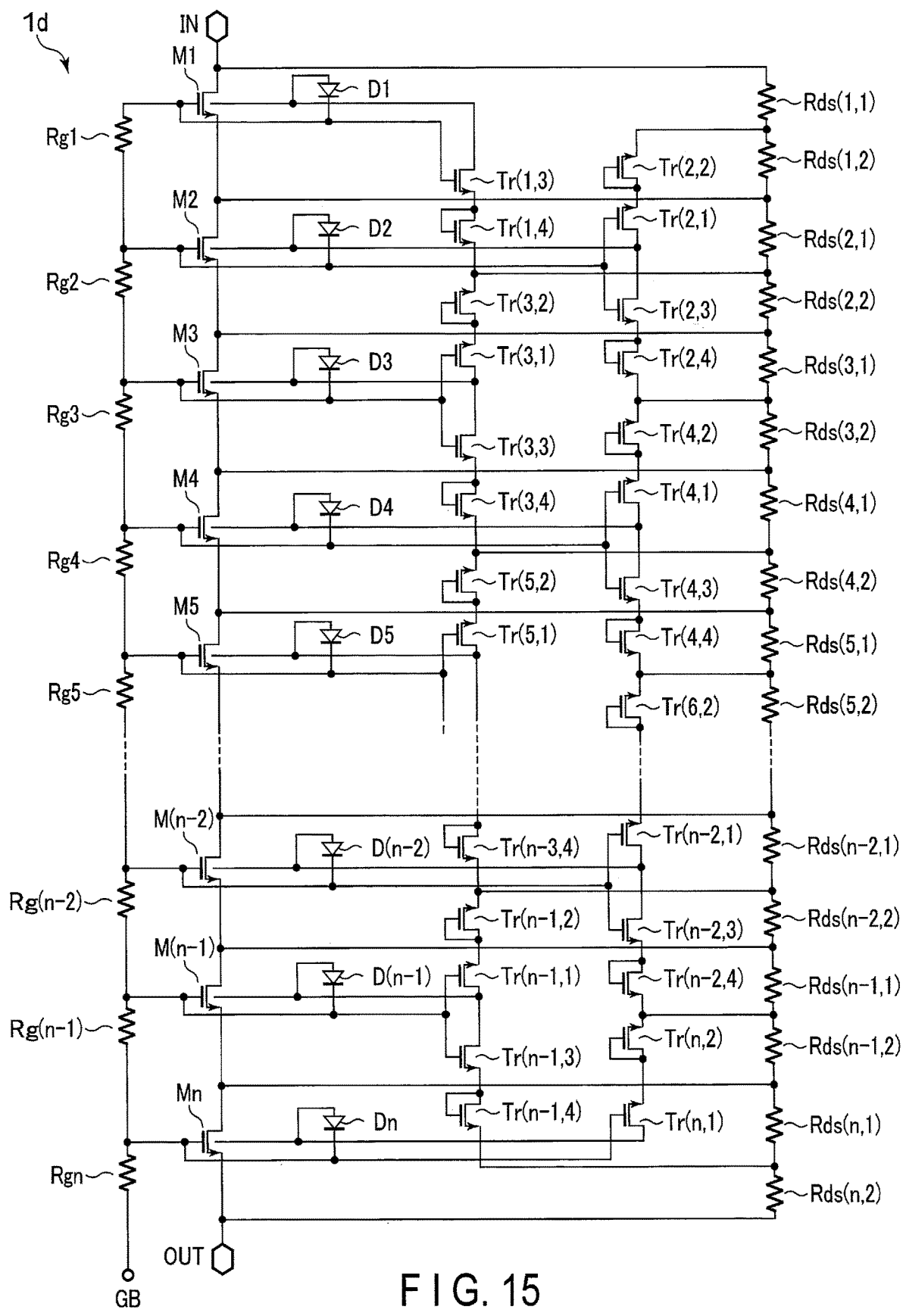
F I G. 15

SEMICONDUCTOR DEVICE

CROSS-REFERENCE TO RELATED APPLICATIONS

This application is based upon and claims the benefit of priority from Japanese Patent Application No. 2021-193171, filed Nov. 29, 2021, and No. 2022-103787, filed Jun. 28, 2022, the entire contents of all of which are incorporated herein by reference.

FIELD

Embodiments described herein relate generally to a semiconductor device.

BACKGROUND

Switch circuits used for portable terminals and the like have been known.

BRIEF DESCRIPTION OF THE DRAWINGS

FIG. 1 is a block diagram for showing an exemplary configuration of a wireless device including a switch circuit according to the first embodiment.

FIG. 2 is a diagram for showing an exemplary circuitry configuration of the switch circuit according to the first embodiment.

FIG. 10 is a diagram for explaining another example of a circuitry configuration of the switch circuit according to the first embodiment.

FIG. 14 is a diagram for showing an exemplary circuitry configuration of a switch circuit according to the fourth embodiment.

FIG. 15 is a diagram for showing an exemplary circuitry configuration of a switch circuit according to the fifth embodiment.

DETAILED DESCRIPTION

Figure 3:
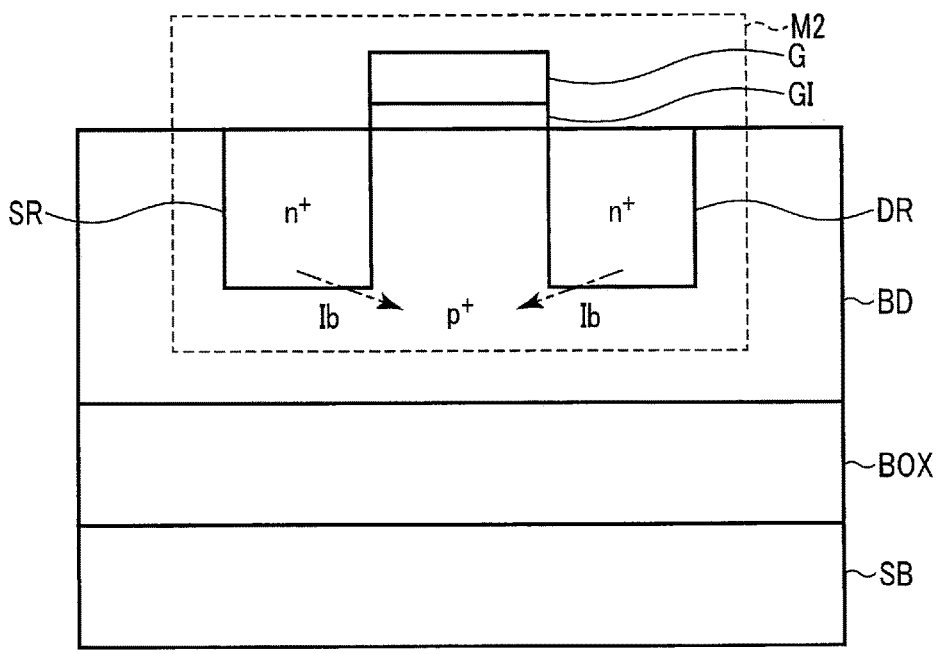
FIG. 3 is a diagram for explaining the configuration of a transistor in the switch circuit according to the first embodiment.

In general, according to one embodiment, a semiconductor device includes an input terminal, an output terminal, and a plurality of transistors. The transistors are coupled through serial coupling between the input terminal and the output terminal. The transistors include a first transistor and a second transistor. The first transistor has a first end and a second end that are used for the serial coupling. The second transistor has a third end, a fourth end, a first gate, and a first body. The third end and the fourth end are used for the serial coupling. The third end is coupled to the second end. The semiconductor device further includes a third transistor and a first diode. The third transistor and the first diode are serially coupled between the first body and the first end. The third transistor includes a second gate coupled to the first gate. An anode of the first diode is arranged on a side of the first body between the first body and the first end. A cathode of the first diode is arranged on a side of the first end between the first body and the first end.

The embodiments will be explained below with reference to the drawings. In the following description, the same reference numerals are assigned to structural components having the same functions and structures. When the structural components with the same reference numerals need to be distinguished from one another, indices may be attached to the numerals. If the structural components do not need to be particularly distinguished, the components will be given the reference numerals only, without any index.

Each of the functional blocks can be realized by hardware or software, or a combination of the two. The functional blocks do not necessarily need to be distinguished from one another as described below. For instance, part of the function may be implemented by a functional block that differs from the exemplified functional block. An exemplified functional block may be further divided into functional sub-blocks. The functional blocks and structural components described below are named as such for the sake of convenience, and the names do not restrict the structures or operations or the functional blocks or structural components.

First Embodiment

A semiconductor device according to the first embodiment will be described below. Hereinafter, the semiconductor device may also be referred to as a "switch circuit 1".
(Exemplary Structure)
(1) Wireless Device FIG. 1 is a block diagram for showing an exemplary configuration of a wireless device WD including the switch circuit 1 according to the first embodiment. The wireless device WD may be a smartphone, a feature phone, a portable terminal (e.g., tablet terminal), a personal computer, a game machine, a router, or a base station. The wireless device WD transmits and receives signals using communication standards such as Long Term Evolution (LTE (trademark)) and/or Wi-Fi. The reference numerals 1a, 1b, 1c, 1d and 1e in FIG. 1 will be described in the subsequent embodiments.

The wireless device WD may include, in addition to the switch circuit 1, an antenna ANT, switch circuits 2, 3, and 4, signal processing circuits 5 and 6, and a control circuit 7.

The antenna ANT receives high-frequency signals from other devices (e.g., a base station or other wireless devices). The antenna ANT may also transmit high-frequency signals from the wireless device WD to other devices.

The control circuit 7 may transmit a control signal CNT to the switch circuits 1, 2, 3, and 4 and to the signal processing circuits 5 and 6. Whether each of the switch circuits 1, 2, 3, and 4 is in an ON state or OFF state is controlled by the control signal CNT that the switch circuit receives from the control circuit 7. During the ON state of a switch circuit, this switch circuit can transfer a signal between the first end and the second end of the switch circuit. On the other hand, during the OFF state of the switch circuit, this switch circuit conducts no transfer between the first end and second end of the switch circuit. Each of the signal processing circuits 5 and 6 performs signal processing based on the control signal CNT received from the control circuit 7.

The first end of the switch circuit 1 is coupled to the antenna ANT, while the second end of the switch circuit 1 is coupled to the signal processing circuit 5. The switch circuit 1 receives a control signal CNT1 from the control circuit 7. The switch circuit 1, which is currently in the ON state in response to the control signal CNT1, transports a high-frequency signal received by the wireless device WD via the antenna ANT to the signal processing circuit 5.

The first end of the switch circuit 2 is coupled to the signal path between the switch circuit 1 and the signal processing circuit 5. The second end of the switch circuit 2 may be grounded.

The switch circuit 2 receives a control signal CNT2 from the control circuit 7. For instance, with the switch circuit 1 being in the OFF state, the switch circuit 2 is in the ON state in response to the control signal CNT2. The switch circuit 2, which is currently in the ON state, sets the potential of a signal path between the switch circuit 1 and signal processing circuit 5 to the ground potential.

The signal processing circuit 5 receives a high-frequency signal transmitted via the switch circuit 1, and executes various kinds of processing upon the high-frequency signal, in response to the control signal CNT3 received from the control circuit 7.

The first end of the switch circuit 3 is coupled to the antenna ANT, while the second end of the switch circuit 3 is coupled to the signal processing circuit 6. The switch circuit 3 receives, for example, a control signal CNT2 from the control circuit 7. The switch circuit 3, which is currently in the ON state in response to the control signal CNT2, transports a high-frequency signal received by the wireless device WD via the antenna ANT to the signal processing circuit 6. The frequency band of the high-frequency signal transmitted by the switch circuit 3 differs, for example, from the frequency band of the high-frequency signal transmitted by the switch circuit 1. The switch circuit 1 and switch circuit 3 may be selectively turned to the ON state under the control of the control circuit 7.

The first end of the switch circuit 4 is coupled to the signal path between the switch circuit 3 and the signal processing circuit 6. The second end of the switch circuit 4 may be grounded. The switch circuit 4 receives a control signal CNT1 from the control circuit 7. For instance, with the switch circuit 3 being in the OFF state, the switch circuit 4 is in the ON state in response to the control signal CNT1. The switch circuit 4, which is currently in the ON state, maintains the potential of the signal path between the switch circuit 3 and signal processing circuit 6 to the ground potential.

The signal processing circuit 6 receives a high-frequency signal transmitted via the switch circuit 3, and executes various kinds of processing upon the high-frequency signal in response to the control signal CNT4 received from the control circuit 7.

In the above description, each of the switch circuits 1 and 3 transmits the high-frequency signal that the wireless device WD has received from other devices. The switch circuits 1 and 3 are not limited thereto. Each of the switch circuits 1 and 3 may transmit a high-frequency signal that the wireless device WD transmits to other devices.

The following description will focus on the switch circuit 1.

(2) Switch Circuit

FIG. 2 shows an exemplary circuitry configuration of the switch circuit 1 according to the first embodiment. In the circuit symbol of each transistor in FIG. 2, one end of the transistor is illustrated as a drain and the other end thereof is illustrated as a source. However, the drain and source may be exchanged in accordance with the relationship between the potentials at the two ends. FIG. 2 shows voltages VM01, VM12, VM23, VM34, VG2, VB2, VR12, and VR23, which will be discussed later in the explanation of the exemplary operation.

The switch circuit 1 includes the number n (where n is a natural number) of transistors M1, M2, M3, M4, M5, . . . , M(n−2), M(n−1), and Mn. These transistors may be field effect transistors (FET) such as n-channel metal oxide semiconductor (MOS) transistors. Throughout this specification, the same applies to other structural components that are referred to as "transistors", unless otherwise specified. In FIG. 2, the first end and second end of the switch circuit 1 are respectively indicated as a terminal IN and a terminal OUT.

The switch circuit 1 further includes resistors Rg1, Rg2, Rg3, Rg4, Rg5, . . . , Rg(n−2), Rg(n−1), and Rgn, and resistors Rb1, Rb2, Rb3, Rb4, . . . , Rb(n−2), Rb(n−1), and Rbn. The switch circuit 1 further includes resistors Rds(1,1), Rds(1,2), Rds(2,1), Rds(2,2), Rds(3,1), Rds(3,2), Rds(4,1), Rds(4,2), Rds(5,1), Rds(5,2), . . . , Rds(n−2,1), Rds(n−2,2), Rds(n−1,1), Rds(n−1,2), Rds(n,1), and Rds(n,2).

For the resistors Rds(1,1), Rds(1,2), Rds(2,1), Rds(2,2), Rds(3,1), Rds(3,2), Rds(4,1), Rds(4,2), Rds(5,1), Rds(5,2), . . . , Rds(n−2,1), Rds(n−2,2), Rds(n−1,1), Rds(n−1,2), Rds(n,1), and Rds(n,2), all of the resistance values thereof are substantially R1. In the following description, it is assumed that the resistance values of these resistors Rds are substantially equal.

The transistors M1, M2, M3, M4, M5, . . . , M(n−2), M(n−1), and Mn are coupled in series between the terminal IN and terminal OUT. In particular, the terminal IN is coupled to the first end of the transistor M1, and the second end of the transistor M1 is coupled to the first end of the transistor M2. The second end of the transistor M2 is coupled to the first end of the transistor M3, and the second end of the transistor M3 is coupled to the first end of the transistor M4. The same applies to the connections of the transistors M4, M5, . . . , M(n−2), M(n−1), and Mn, and the second end of the transistor Mn is coupled to the terminal OUT.

The resistor Rg1 is coupled between the gate (hereinafter it may also be referred to as a "control end") of the transistor M1 and the gate of the transistor M2. The resistor Rg2 is coupled between the gate of the transistor M2 and the gate of the transistor M3. The resistor Rg3 is coupled between the gate of the transistor M3 and the gate of the transistor M4. The same applies to the resistors Rg4, Rg5, ..., Rg(n−2), and Rg(n−1). The gate of the transistor Mn is coupled to one end of the resistor Rgn. The other end of the resistor Rgn is coupled to a node to which a signal GB is input. FIG. 2 shows a control end through which a signal GB is input to the switch circuit 1. The signal GB may be the control signal CNT1 discussed with reference to FIG. 1. The signal GB can be switched by the control circuit 7 between the high (H) level and low (L) level. Throughout the specification, the term "level" indicates a voltage level, unless otherwise specified.

The resistor Rb1 is coupled between the body of the transistor M1 (hereinafter it may also be referred to as a "backgate") and the body of the transistor M2. The resistor Rb2 is coupled between the body of the transistor M2 and the body of the transistor M3. The resistor Rb3 is coupled between the body of the transistor M3 and the body of the transistor M4. The same applies to the resistors Rb4, ..., Rb(n−2), and Rb(n−1). The body of the transistor Mn is coupled to one end of the resistor Rbn. The other end of the resistor Rbn is coupled to a node through which a signal BB is input. FIG. 2 further shows the control end through which a signal BB is input into the switch circuit 1. The signal BB may be supplied by the control circuit 7. The voltage of the signal BB is set in accordance with the voltage of the signal GB.

The first end of the transistor M1 is coupled to one end of the resistor Rds(1,1), the other end of the resistor Rds(1,1) is coupled to one end of the resistor Rds(1,2), and the other end of the resistor Rds(1,2) is coupled to the second end of the transistor M1. The first end of the transistor M2 is coupled to one end of the resistor Rds(2,1), the other end of the resistor Rds(2,1) is coupled to one end of the resistor Rds(2,2), and the other end of the resistor Rds(2,2) is coupled to the second end of the transistor M2. The first end of the transistor M3 is coupled to one end of the resistor Rds(3,1), the other end of the resistor Rds(3,1) is coupled to one end of the resistor Rds(3,2), and the other end of the resistor Rds(3,2) is coupled to the second end of the transistor M3. The same applies to the resistors Rds(4,1), Rds(4,2), Rds(5,1), Rds(5,2), ..., Rds(n−2,1), Rds(n−2,2), Rds(n−1,1), Rds(n−1,2), Rds(n,1), and Rds(n,2).

Each of the resistors Rg, Rb, and Rds may be formed by using polysilicon, for example.

The switch circuit 1 further includes, as structural components of the feedback circuit, transistors Tr(1,3), Tr(1,4), Tr(2,1), Tr(2,2), Tr(2,3), Tr(2,4), Tr(3,1), Tr(3,2), Tr(3,3), Tr(3,4), Tr(4,1), Tr(4,2), Tr(4,3), Tr(4,4), Tr(5,1), Tr(5,2), Tr(5,3), Tr(5,4), ..., Tr(n−2,1), Tr(n−2,2), Tr(n−2,3), Tr(n−2,4), Tr(n−1,1), Tr(n−1,2), Tr(n−1,3), Tr(n−1,4), Tr(n,1), and Tr(n,2).

The transistors Tr(1,3) and Tr(1,4) correspond to the transistor M1.

The first end of the transistor Tr(1,3) is coupled to the body of the transistor M1, and the gate of the transistor Tr(1,3) is coupled to the gate of the transistor M1. The second end of the transistor Tr(1,3) is coupled to the first end of the transistor Tr(1,4) and to the gate of the transistor Tr(1,4). That is, the second end of the transistor Tr(1,3) is coupled to the diode-connected transistor Tr(1,4). The second end of the transistor Tr(1,4) is coupled to a node mutually coupling the resistor Rds(2,1) and the resistor Rds(2,2).

The following holds when the integer k is any integer between 2 to n−1.

The transistors Tr(k,1), Tr(k,2), Tr(k,3), and Tr(k,4) correspond to the transistor Mk.

The first end of the transistor Tr(k,1) is coupled to the body of the transistor Mk, and the gate of the transistor Tr(k,1) is coupled to the gate of the transistor Mk. The second end of the transistor Tr(k,1) is coupled to the first end of the transistor Tr(k,2) and to the gate of the transistor Tr(k,2). In this manner, the second end of the transistor Tr(k,1) is coupled to the diode-connected transistor Tr(k,2). The second end of the transistor Tr(k,2) is coupled to a node mutually coupling the resistor Rds(k−1,1) and the resistor Rds(k−1,2).

The first end of the transistor Tr(k,3) is coupled to the body of the transistor Mk, and the gate of the transistor Tr(k,3) is coupled to the gate of the transistor Mk. The second end of the transistor Tr(k,3) is coupled to the first end of the transistor Tr(k,4) and to the gate of the transistor Tr(k,4). In this manner, the second end of the transistor Tr(k,3) is coupled to the diode-connected transistor Tr(k,4). The second end of the transistor Tr(k,4) is coupled to a node mutually coupling the resistor Rds(k+1,1) and the resistor Rds(k+1,2).

The transistors Tr(n,1) and Tr(n,2) correspond to the transistor Mn.

The first end of the transistor Tr(n,1) is coupled to the body of the transistor Mn, and the gate of the transistor Tr(n,1) is coupled to the gate of the transistor Mn. The second end of the transistor Tr(n,1) is coupled to the first end of the transistor Tr(n,2) and to the gate of the transistor Tr(n,2). In this manner, the second end of the transistor Tr(n,1) is coupled to the diode-connected transistor Tr(n,2). The second end of the transistor Tr(n,2) is coupled to a node mutually coupling the resistor Rds(n−1,1) and the resistor Rds(n−1,2).

With the signal GB being at an H level, the transistors M1, M2, M3, M4, M5, ..., M(n−2), M(n−1), and Mn are in the ON state, which means that the switch circuit 1 is in the ON state.

With the signal GB being at an L level, the transistors M1, M2, M3, M4, M5, ..., M(n−2), M(n−1), and Mn are in the OFF state, which means that the switch circuit 1 is in the OFF state. With the switch circuit 1 being in the OFF state, since the resistors Rds have the above-mentioned coupling relationship, the voltage applied between the terminal IN and terminal OUT is divided, and the divided voltages are individually applied to the transistors M1, M2, M3, M4, M5, ..., M(n−2), M(n−1), and Mn. The voltages applied to the transistors M1, M2, M3, M4, M5, ..., M(n−2), M(n−1), and Mn are substantially equal to each other.

If the potential (hereinafter this may also be referred to as a "voltage") at the body of the transistor M2 is higher than the voltage at the second end of the transistor Tr(2,2), a current flows from the body via the transistors Tr(2,1) and Tr(2,2) during the ON state of the transistors Tr(2,1) and Tr(2,2). With such a current flow, the voltage of the body decreases. Whether the transistor Tr(2,1) is in the ON state or in the OFF state depends on the voltage at the gate of the transistor M2. This is because the gate of the transistor Tr(2,1) is coupled to the gate of the transistor M2.

If the voltage at the body of the transistor M2 is higher than the voltage at the second end of the transistor Tr(2,4), a current flows from the body via the transistors Tr(2,3) and Tr(2,4) during the ON state of the transistors Tr(2,3) and Tr(2,4). With such a current flow, the voltage of the body decreases. Whether the transistor Tr(2,3) is in the ON state or in the OFF state depends on the voltage at the gate of the transistor M2. This is because the gate of the transistor Tr(2,3) is coupled to the gate of the transistor M2.

The above description relates to the transistors Tr(2,1), Tr(2,2), Tr(2,3), and Tr(2,4), which correspond to the transistor M2. The same holds for the transistors Tr that correspond to other transistors M.

In the above description, the second end of the transistor Tr(2,2), for example, is coupled to the node mutually coupling the resistor Rds(1,1) and resistor Rds(1,2). If the resistance value of the resistor Rds(1,1) is extremely small, this coupling relationship may be interpreted as the second end of the transistor Tr(2,2) being coupled to the first end of the transistor M1 without any resistor intervening. If the resistance value of the resistor Rds(1,1) is extremely small, the resistance value of the resistor Rds(1,2) will differ from the resistance value of the resistor Rds(1,1). The same holds for other transistors Tr having similar connections.

In the above description, the transistor Tr(2,1) having the gate coupled to the gate of the transistor M2 and the transistor Tr(2,2) having a diode connection are coupled in this order in the path between the body of the transistor M2 and the first end of the transistor M1. The present embodiment, however, is not limited thereto. The transistor Tr(2,1) and the transistor Tr(2,2) may be coupled in the reverse order in the path between the body of the transistor M2 and the first end of the transistor M1. The same holds for other transistors Tr having similar connections.

As the structural components of the switch circuit 1, diode-coupled transistors such as the transistors Tr(1,4), Tr(2,2), Tr(2,4), Tr(3,2), Tr(3,4), . . . , Tr(n−1,2), Tr(n−1,4), and Tr(n,2) have been discussed. In the switch circuit 1, a diode of a PN junction may be adopted in place of these transistors Tr. The same holds for other diode-connected transistors described in this specification. Throughout this specification, a "diode" is intended to mean possible use of both a diode-connected transistor and a PN junction diode. Whichever is used, the electrodes of the diode will be referred to as an anode and a cathode throughout the specification.

FIG. 3 is a diagram for explaining the configuration of the transistor M2 in the switch circuit 1 according to the first embodiment. FIG. 3 shows a partial cross-sectional structure of the switch circuit 1. In the following description, the structure of the transistor M2 will be discussed as an example. Other transistors M have a structure similar to what is discussed below. As one example, the switch circuit 1 formed on the silicon-on-insulator (SOI) substrate will be dealt with.

An oxide film BOX is formed on the top surface of the semiconductor substrate SB. A semiconductor layer is deposited as a body layer BD on the top surface of the oxide film BOX. For example by doping with boron (B), the body layer BD can be adopted as a p+ impurity diffusion layer. The source region SR and drain region DR are arranged on the surface of the body layer BD and spaced apart from each other. Each of the source region SR and drain region DR may be doped with phosphorus (P) and adopted as an n+ impurity diffusion region. A gate electrode G is formed on the top surface of the body layer BD between the source region SR and drain region DR with a gate insulator GI interposed. The transistor M2 includes the source region SR, drain region DR, and gate electrode G.

A connection between the gate of the transistor M2 and other structural components is formed by way of a contact plug (not shown) formed on the top surface of the gate electrode G. Similarly, connections between the first end of the transistor M2 and other structural components and between the second end of the transistor M2 and other structural components are formed by way of the contact plugs (not shown) formed on the top surfaces of the drain region DR and source region SR.

For instance, if the voltage of the drain region DR is higher than the voltage of the body layer BD, a leak current Ib may be caused to flow from the drain region DR to the body layer BD. Similarly, if the voltage of the source region SR is higher than the voltage of the body layer BD, a leak current Ib may be caused to flow from the source region SR to the body layer BD.

With such a leak current Ib generated, the voltage at the body of the transistor M2 may increase. With the currents flowing via the different transistors Tr corresponding to the transistor M2, however, the increase in the voltage can be suppressed.

(Exemplary Operations)

The exemplary operation of the switch circuit 1 according to the first embodiment being in the OFF state will be described below.

(1) Overall Operation of Switch Circuit 1

Figure 4:
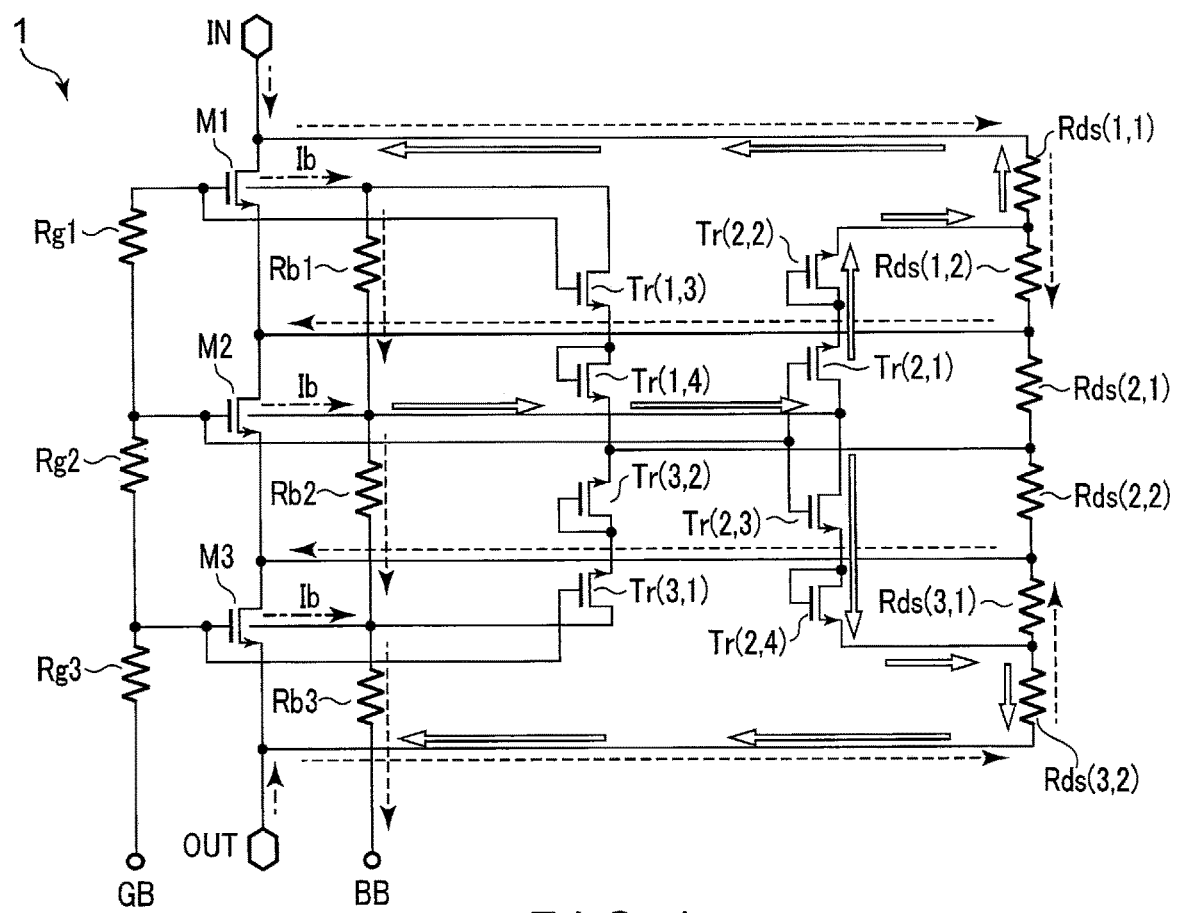
FIG. 4 is a diagram for explaining different currents that flow in the switch circuit according to the first embodiment being in an OFF state.

FIG. 4 is a diagram for explaining various currents that flow in the switch circuit 1 according to the first embodiment which is currently in the OFF state. For the sake of simplicity, the circuit structure of the switch circuit 1 when n is 3 is illustrated in FIG. 4. It is assumed below that n is equal to 3.

In response to a high-frequency signal input to the terminal IN, the leak current Ib discussed above by referring to FIG. 3 may be caused in the transistors M1, M2, and M3.

Such a leak current Ib may increase the bias potentials (hereinafter it may also be referred to as "bias voltages") of the bodies of the transistors M1, M2, and M3, as described in detail below.

A leak current Ib may affect the current flowing in each of the resistors Rb1, Rb2, and Rb3. For instance, the leak current Ib, which is affecting the flow of the current from the body of the transistor M1 via the resistor Rb1, the flow of the current from the body of the transistor M2 via the resistor Rb2, and the flow of the current from the body of the transistor M3 via the resistor Rb3, is illustrated in FIG. 4. This changes the amount of voltage drop across each of the resistors Rb. The increase amount in the bias voltage at the body of each of the transistors M1, M2, and M3 corresponds to this change in the amount of voltage drop.

Such a leak current Ib also lowers the bias voltages at the second end of the transistor M1, the first end and second end of the transistor M2, and the first end of the transistor M3, as described in detail below.

The leak current Ib may affect the flow of the current from the terminal IN via the resistors Rds(1,1) and Rds(1,2) to the node mutually coupling the second end of the transistor M1 and the first end of the transistor M2. The leak current Ib may affect the flow of the current from the terminal OUT via the resistors Rds(3,2) and Rds(3,1) to the node mutually coupling the second end of the transistor M2 and the first end of the transistor M3. This changes the amount of voltage drop across each of the resistors Rds. The amounts of drop of the bias voltages at the second end of the transistor M1, the first end and second end of the transistor M2, and the first end of the transistor M3 corresponds to this change in the amount of voltage drop.

The above description relates to the case of n being 3. The same applies to the case of n being any integer other than 3. That is, the leak current Ib caused at each of the transistors M may raise the bias voltage at the body of each of the transistors M, and may lower the bias voltage at the first end and/or second end of each of the transistors M.

In the switch circuit 1, a current may flow via the feedback circuit as described below. The current flowing via the transistors Tr(2,1), Tr(2,2), Tr(2,3), and Tr(2,4) corresponding to the transistor M2 will be described as an example. The same holds for the transistors Tr corresponding to other transistors M.

It is assumed that the voltage at the body of the transistor M2 is higher than the voltage at the second end of the transistor Tr(2,2). A current flows from this body to the second end of the transistor Tr(2,2) with the transistors Tr(2,1) and Tr(2,2) being in the ON state. This current affects the current from the second end via the resistor Rds(1,1) to the node mutually coupling the resistor Rds(1,1) and the first end of the transistor M1.

It is assumed that the voltage at the body of the transistor M2 is higher than the voltage at the second end of the transistor Tr(2,4). A current flows from this body to the second end of the transistor Tr(2,4) with the transistors Tr(2,3) and Tr(2,4) being in the ON state. This current affects the current flowing from the second end via the resistor Rds(3,2) to the node coupling the resistor Rds(3,2) and the second end of the transistor M3.

The above description relates to the case of n being 3. The same applies to the case of n being any integer other than 3. As mentioned above, the current flow from the body of each of the transistors M via the respective feedback circuit suppresses an increase in the bias voltage at the body of each transistor M, and lowers the bias voltage. This current flow also suppresses a decrease in the bias voltage at the first end and/or second end of the transistor M, and raises the bias voltage.

In relation to the above operation, an exemplary operation of the switch circuit 1 in response to various high-frequency signals input to the terminal IN will be further described in detail. Of the serially coupled transistors M1, M2, M3, ..., and Mn, the transistor M2 will be focused on in the following description in the same manner as for FIG. 4.

The voltages VM01, VM12, VM23, VM34, VG2, VB2, VR12, and VR23 indicated in FIG. 2 will be referred to in the following description. Furthermore, it is assumed that a voltage of 0 volts (V) is applied as a bias voltage to the terminal IN and terminal OUT.

The voltage VM01 is a voltage at the first end of the transistor M1; the voltage VM12 is a voltage at the second end of the transistor M1 and also at the first end of the transistor M2; the voltage VM23 is a voltage at the second end of the transistor M2 and also at the first end of the transistor M3; the voltage VM34 is a voltage at the second end of the transistor M3 and also at the first end of the transistor M4; the voltage VG2 is a voltage at the gate of the transistor M2; the voltage VB2 is a voltage at the body of the transistor M2; the voltage VR12 is a voltage at a node coupling the second end of the transistor Tr(2,2), the resistor Rds(1,1) and the resistor Rds(1,2) to one another; and the voltage VR23 is a voltage at a node coupling the second end of the transistor Tr(2,4), the resistor Rds(3,1) and the resistor Rds(3,2) to one another.

(2) First Exemplary Operation of Switch Circuit 1

Figure 5:
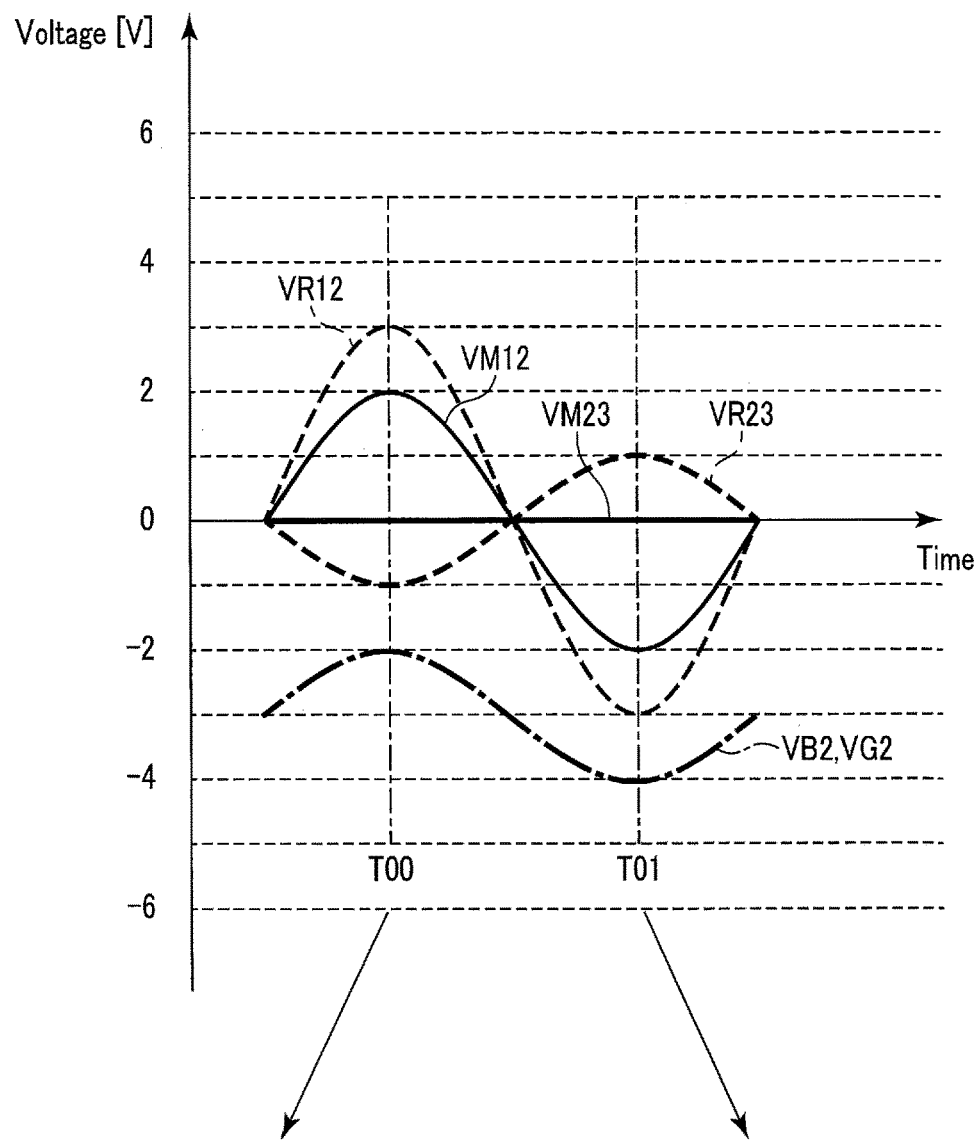
FIG. 5 is a diagram for explaining the operation of the switch circuit according to the first embodiment in response to a first high-frequency signal input to the switch circuit.
Figure 5:
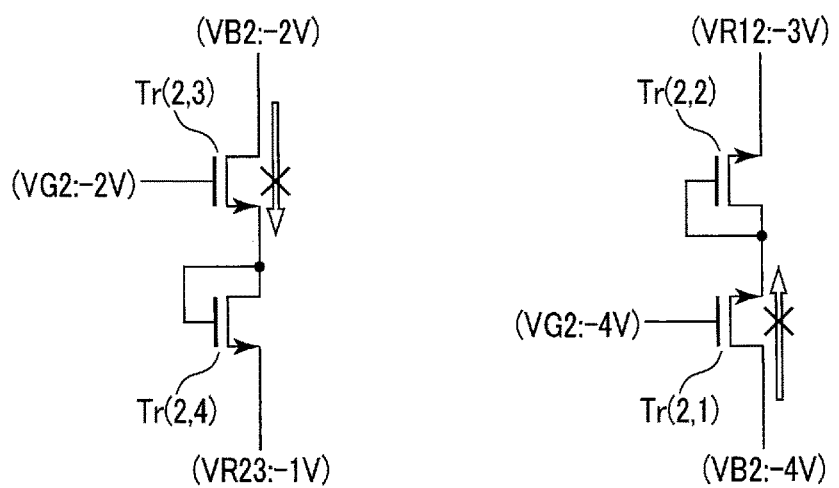

FIG. 5 is a diagram for explaining the operation of the switch circuit 1 according to the first embodiment in response to a first high-frequency signal input to the switch circuit 1.

Exemplary waveforms of the voltages VM12, VM23, VG2, VB2, VR12, and VR23 in response to the first high-frequency signal input to the terminal IN are plotted in FIG. 5, where the horizontal axis indicates time, and the vertical axis indicates the voltage value. For the sake of simplicity, a potential difference with respect to the voltage VM23 at the second end of the transistor M2 is presented as a voltage value. In the following, voltage values and signal waveforms are presented by using the voltage VM23 as the reference. Furthermore, the voltage values mentioned below are mere examples for simplification of the description. The same holds for similar drawings that will be later mentioned.

In response to the first high-frequency signal input to the terminal IN, the voltage of the signal applied between the first end and second end of each of the transistors M becomes a high-frequency signal of 2 V in the example of FIG. 5, due to the voltage division in accordance with the aforementioned coupling relationship of the resistors Rds. Here, the signal of the voltage VM12 is a high-frequency signal of 2 V. The signal of the voltage VR12 is a high-frequency signal of 3 V, and the signal of the voltage VR23 is a high-frequency signal of 1 V. These signals are based on the voltage division by the resistors Rds(1,1) and Rds(1,2) and the voltage division by the resistor Rds(3,1) and Rds(3,2). The signal of the voltage VR12 is substantially in the same phase as the signal of the voltage VM12, and the signal of the voltage VR23 is substantially in the opposite phase with respect to the signal of the voltage VM12.

In the example of FIG. 5, the voltage of the signal GB at the L level is −3 V. This means that the signal of the voltage VG2 is a signal obtained by overlaying a high-frequency signal of 1 V on the signal of −3 V serving as a bias voltage. The signal of the voltage VG2 is substantially in the same phase as the signal of the voltage VM12. These signals are based, for example, on the parasitic capacitances produced between the gate and first end of the transistor M2 and between the gate and second end of the transistor M2.

In the example of FIG. 5, the voltage of the signal BB is also −3 V. Thus, the signal of the voltage VB2 is a signal obtained by overlaying the high-frequency signal of 1 V on the voltage of −3 V serving as a bias voltage. The signal of the voltage VB2 is substantially in the same phase as the signal of the voltage VM12. These signals are based, for example, on the parasitic capacitances produced between the body and first end of the transistor M2 and between the body and second end of the transistor M2.

Whether or not a current flows from the body of the transistor M2 via the transistors Tr(2,1) and Tr(2,2) corresponding to the transistor M2 may be based on the voltage VB2, voltage VR12, and voltage VG2. Whether or not a current flows from the body of the transistor M2 via the transistors Tr(2,3) and Tr(2,4) corresponding to the transistor M2 may be based on the voltage VB2, voltage VR23, and voltage VG2.

Whether or not such currents flow from the bodies at time T00 and time T01 will be explained. At time T00, the voltage VM12 reaches its maximum value, while at time T01, the voltage VM12 falls to its minimum value.

At time T00, the voltage VB2 and voltage VG2 are −2 V, the voltage VR12 is 3 V, and the voltage VR23 is −1 V. With the voltage VB2 being lower than the voltage VR23, a current will not flow from the body via the transistors Tr(2,3)

and Tr(2,4). Similarly, a current will not flow from the body via the transistors Tr(2,1) and Tr(2,2).

At time T01, the voltage VB2 and voltage VG2 are −4 V, the voltage VR12 is −3 V, and the voltage VR23 is 1 V. With the voltage VB2 being lower than the voltage VR12, a current will not flow from the body via the transistors Tr(2,1) and Tr(2,2). Similarly, a current will not flow from the body via the transistors Tr(2,3) and Tr(2,4).

As described above, since the voltage VB2 is lower than the voltage VR23 and voltage VR12 in the example of FIG. 5, no current flows from the body.

(3) Second Exemplary Operation of Switch Circuit 1

Figure 6:
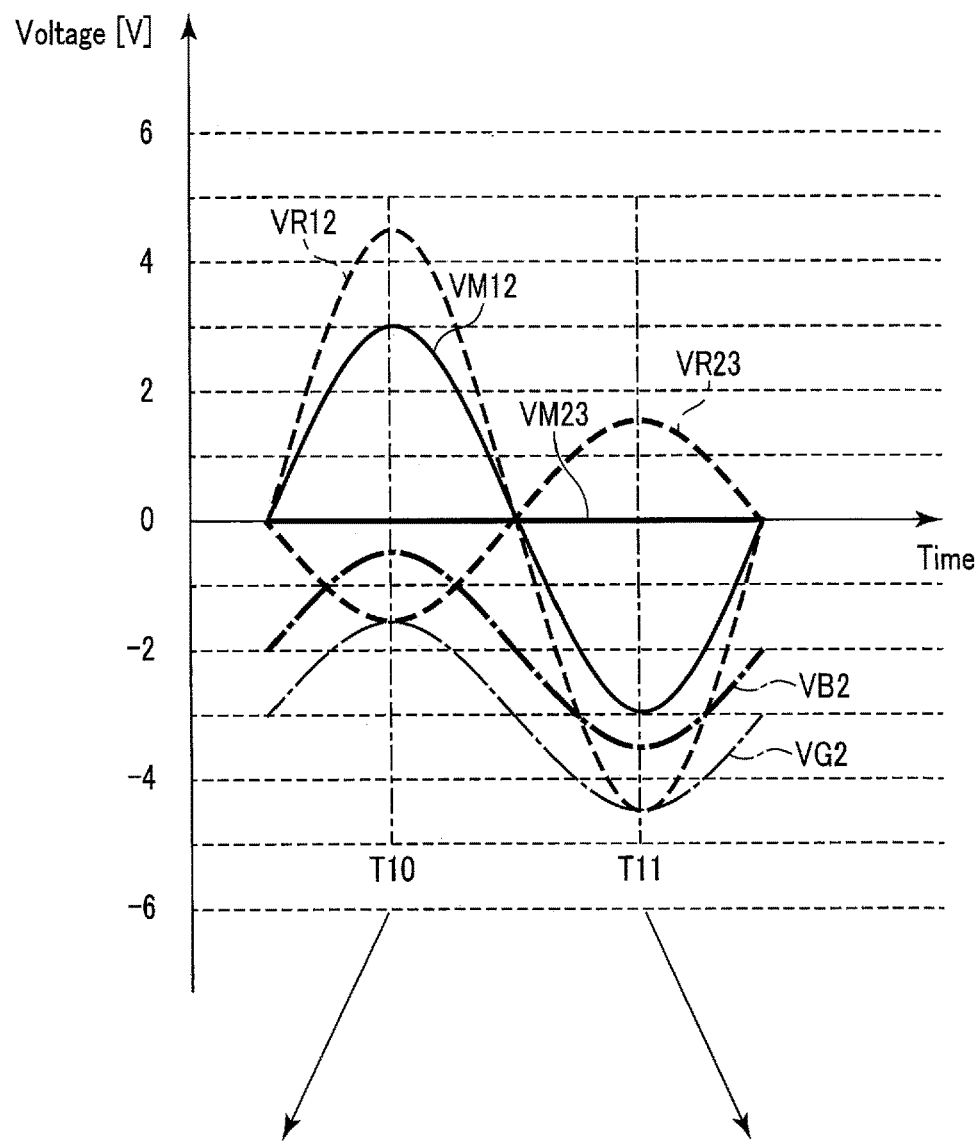
FIG. 6 is a diagram for explaining the operation of the switch circuit according to the first embodiment in response to a second high-frequency signal input to the switch circuit.
Figure 6:
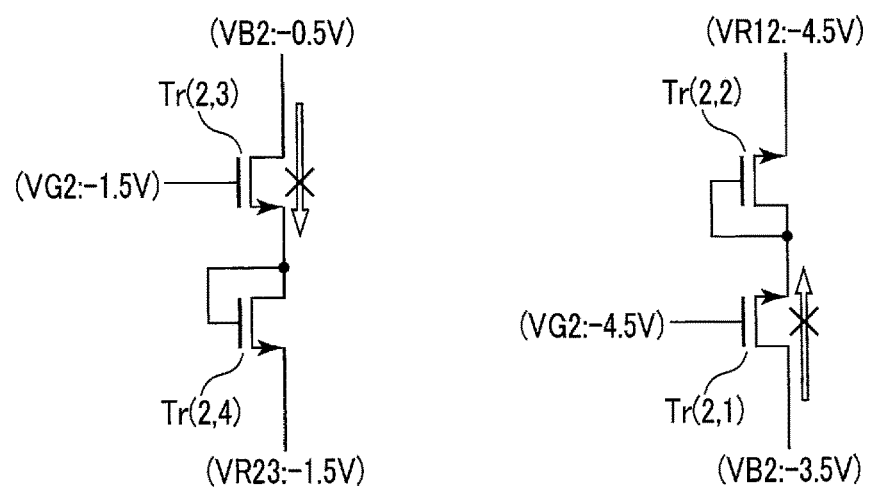

FIG. 6 is a diagram for explaining the operation of the switch circuit 1 according to the first embodiment in response to a second high-frequency signal input to the switch circuit 1. Exemplary waveforms of the voltages VM12, VM23, VG2, VB2, VR12, and VR23 in response to the second high-frequency signal input to the terminal IN are plotted in FIG. 6, where the horizontal axis indicates time, and the vertical axis indicates the voltage value.

In response to the second high-frequency signal input to the terminal IN, the voltage of the signal applied between the first end and second end of each transistor M becomes a high-frequency signal of 3 V in the example of FIG. 6, due to the voltage division in accordance with the aforementioned coupling relationship of the resistors Rds. Here, the signal of the voltage VM12 is a high-frequency signal of 3 V, the signal of the voltage VR12 is a high-frequency signal of 4.5 V, and the signal of the voltage VR23 is a high-frequency signal of 1.5 V. The signal of the voltage VR12 is substantially in the same phase as the signal of the voltage VM12, and the signal of the voltage VR23 is substantially in the opposite phase with respect to the signal of the voltage VM12.

In the example of FIG. 6, the voltage of the signal GB at the L level is −3 V. This means that the signal of the voltage VG2 is a signal obtained by overlaying a high-frequency signal of 1.5 V on the signal of −3 V serving as a bias voltage. The signal of the voltage VG2 is substantially in the same phase as the signal of the voltage VM12.

With the amplitude of the second high-frequency signal being larger than the amplitude of the first high-frequency signal, a leak current Ib is produced at the transistor M2 in the example of FIG. 6. The leak current Ib increases the bias voltage at the body of the transistor M2, as described above with reference to FIG. 4. This means that the signal of the voltage VB2 is a signal obtained by overlaying a high-frequency signal of 1.5 V on a signal serving as a bias voltage and having a voltage of −2 V, which has been raised from −3 V, the voltage of the signal BB. The signal of the voltage VB2 is substantially in the same phase as the signal of the voltage VM12. In the example of FIG. 6, it is assumed for the sake of simplicity that no voltage drop occurs at the second end of the transistor M1, the first end and second end of the transistor M2, or the first end of the transistor M3 that are described with reference to FIG. 4.

Whether or not a current flows from the body of the transistor M2 via the transistors Tr(2,1) and Tr(2,2) or via the transistors Tr(2,3) and Tr(2,4) will be discussed with respect to time T10 and time T11. At time T10, the voltage VM12 reaches its maximum value, while at time T11, the voltage VM12 falls to its minimum value.

At time T10, the voltage VB2 is −0.5 V, the voltage VG2 is −1.5 V, the voltage VR12 is 4.5 V, and the voltage VR23 is −1.5 V. Although the voltage VB2 is higher than the voltage VR23, a current will not flow from the body via the transistors Tr(2,3) and Tr(2,4). This is because the voltage VG2 is not high enough to turn the transistor Tr(2,3) to the ON state, and therefore the transistor Tr(2,3) stays in the OFF state. In the same manner as in the example of FIG. 5, with the voltage VB2 being lower than the voltage VR12, a current will not flow from the body via the transistors Tr(2,1) and Tr(2,2).

At time T11, the voltage VB2 is −3.5 V, the voltage VG2 is −4.5 V, the voltage VR12 is −4.5 V, and the voltage VR23 is 1.5 V. Although the voltage VB2 is higher than the voltage VR12, a current will not flow from the body via the transistors Tr(2,1) and Tr(2,2). This is because the voltage VG2 is not high enough to turn the transistor Tr(2,1) into the ON state, and therefore the transistor Tr(2,1) stays in the OFF state. In the same manner as in the example of FIG. 5, with the voltage VB2 being lower than the voltage VR23, a current will not flow from the body via the transistors Tr(2,3) and Tr(2,4).

As described above, in the example of FIG. 6, even if the voltage VB2 is higher than the voltage VR23, the transistor Tr(2,3) remains in the OFF state. Furthermore, even if the voltage VB2 is higher than the voltage VR12, the transistor Tr(2,1) remains in the OFF state. Thus, no current flows from the body.

(4) Third Exemplary Operation of Switch Circuit 1

Figure 7:
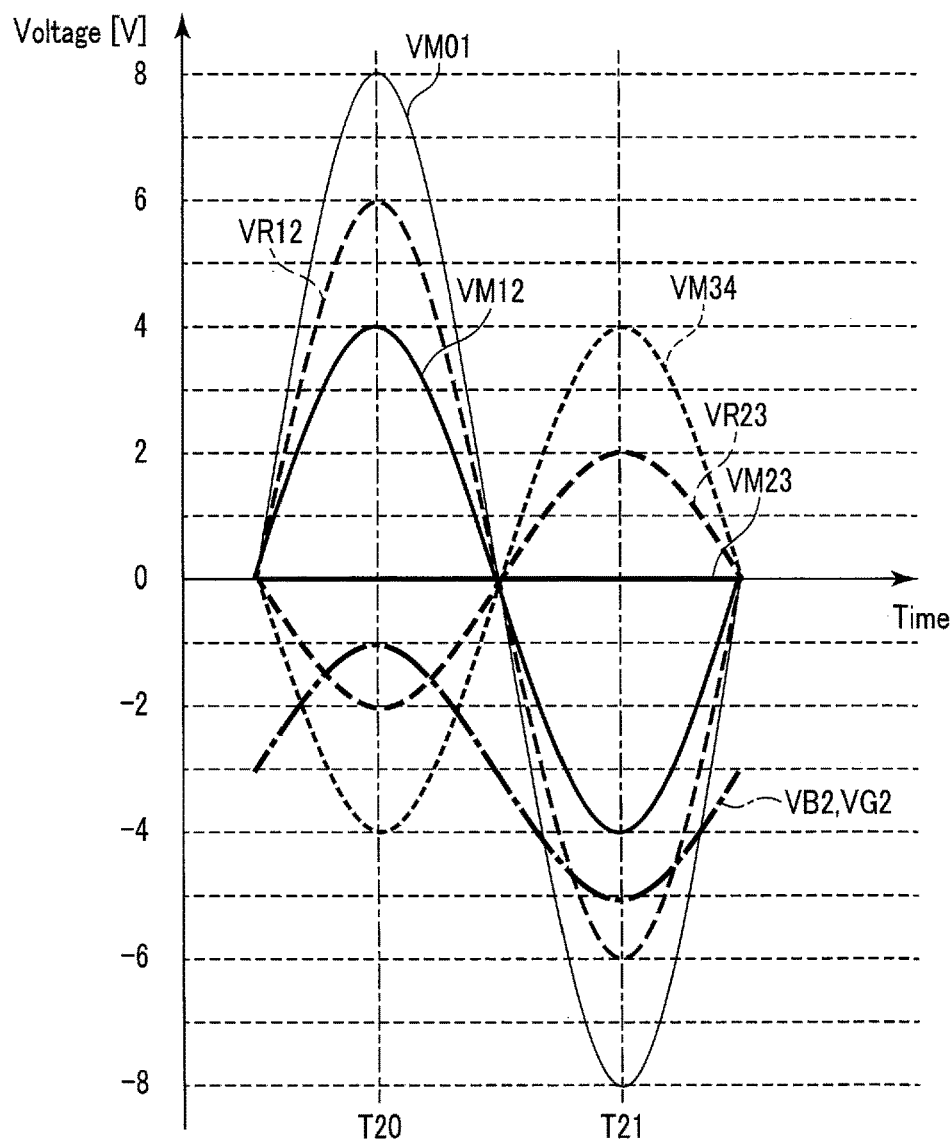
FIG. 7 is a diagram for explaining the operation of the switch circuit according to the first embodiment in response to a third high-frequency signal input to the switch circuit.
Figure 7:
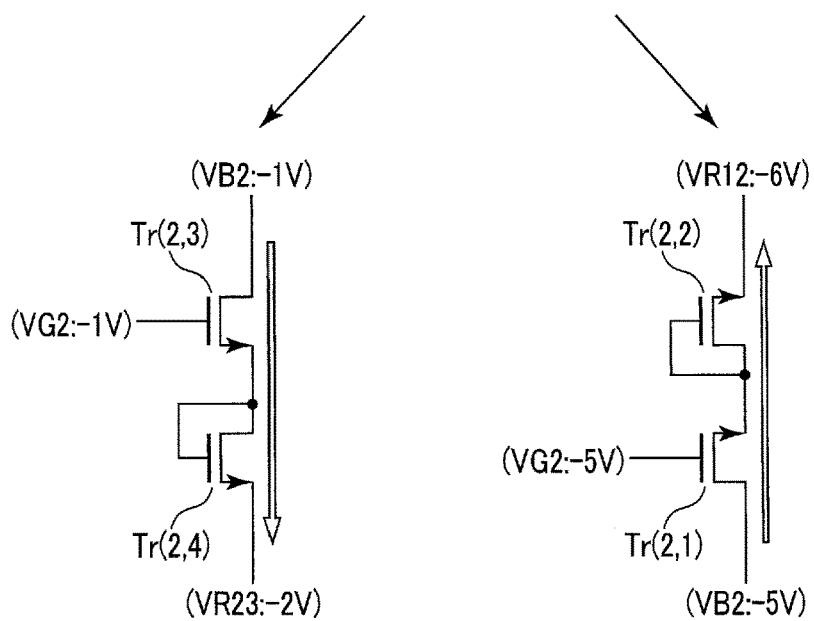

FIG. 7 is a diagram for explaining the operation of the switch circuit 1 according to the first embodiment in response to a third high-frequency signal input to the switch circuit 1. Exemplary waveforms of the voltages VM01, VM12, VM23, VM34, VG2, VB2, VR12, and VR23 in response to the third high-frequency signal input to the terminal IN are plotted in FIG. 7, where the horizontal axis indicates time and the vertical axis indicates the voltage value.

In response to the third high-frequency signal input to the terminal IN, the signal of the voltage applied between the first end and second end of each transistor M becomes a high-frequency signal of 4 V in the example FIG. 7, due to the voltage division in accordance with the aforementioned coupling relationship of the resistors Rds. Here, the signal of the voltage VM01 is a high-frequency signal of 8 V, the signal of the voltage VM12 is a high-frequency signal of 4 V, the signal of the voltage VM34 is a high-frequency signal of 4 V, the signal of the voltage VR12 is a high-frequency signal of 6 V, and the signal of the voltage VR23 is a high-frequency signal of 2 V. The signal of the voltage VM01, the signal of the voltage VM12, and the signal of the voltage VR12 are substantially in the same phase. The signal of the voltage VM34 and the signal of the voltage VR23 are substantially in the opposite phase with respect to the signal of the voltage VM12.

In the example of FIG. 7, the voltage of the signal GB at the L level is −3 V. This means that the signal of the voltage VG2 is a signal obtained by overlaying a high-frequency signal of 2 V on the signal of −3 V serving as a bias voltage. The signal of the voltage VG2 is substantially in the same phase as the signal of the voltage VM12.

In the example of FIG. 7, the voltage of the signal BB is also −3 V. This means that the signal of the voltage VB2 is a signal obtained by overlaying the high-frequency signal of 2 V on the voltage of −3 V serving as a bias voltage. The signal of the voltage VB2 is substantially in the same phase as the signal of the voltage VM12.

Whether or not a current flows from the body of the transistor M2 via the transistors Tr(2,1) and Tr(2,2) or via the transistors Tr(2,3) and Tr(2,4) will be discussed with respect to time T20 and time T21. At time T20, the voltage VM12 reaches its maximum value, while at time T21, the voltage VM12 falls to its minimum value.

At time T20, the voltage VB2 and voltage VG2 are −1 V, the voltage VR12 is 6 V, and the voltage VR23 is −2 V. Here, the voltage VB2 is higher than the voltage VR23, and the voltage VG2 is high enough to turn the transistor Tr(2,3) to the ON state. Thus, with the transistor Tr(2,3) and transistor Tr(2,4) being in the ON state, a current flows from the body via the transistors Tr(2,3) and Tr(2,4). This current flows from the second end of the transistor Tr(2,4) to the node coupling the second end of the transistor M3 to the first end of the transistor M4. This is because the voltage VR23 is higher than the voltage VM34. Such a current flow lowers the bias voltage of the body. On the other hand, since the voltage VB2 is lower than the voltage VR12 in the same manner as in the example of FIG. 5, a current will not flow from the body via the transistors Tr(2,1) and Tr(2,2).

At time T21, the voltage VB2 and voltage VG2 are −5 V, the voltage VR12 is −6 V, and the voltage VR23 is 2 V. Here, the voltage VB2 is higher than the voltage VR12, and the voltage VG2 is high enough to turn the transistor Tr(2,1) to the ON state. Thus, with the transistor Tr(2,1) and transistor Tr(2,2) being in the ON state, a current flows from the body via the transistors Tr(2,1) and Tr(2,2). This current flows from the second end of the transistor Tr(2,2) to the node coupling the second end to the first end of the transistor M1. This is because the voltage VR12 is higher than the voltage VM01. Such a current flow lowers the bias voltage of the body. On the other hand, since the voltage VB2 is lower than the voltage VR23 in the same manner as in the example of FIG. 5, a current will not flow from the body via the transistors Tr(2,3) and Tr(2,4).

With the amplitude of the third high-frequency signal being larger than the amplitude of the second high-frequency signal, a leak current Ib is produced at the transistor M2 in the example of FIG. 7. This leak current Ib tends to raise the bias voltage at the body of the transistor M2. On the other hand, as mentioned above, a current flows from the body via the transistors Tr(2,1) and Tr(2,2), and via the transistors Tr(2,3) and Tr(2,4). Such current flows can suppress the increase in the bias voltage at the body of the transistor M2. Thus, in the example of FIG. 7, no increase in the bias voltage is observed in the signal of the voltage VB2, unlike in the example of FIG. 6.

Figure 8:
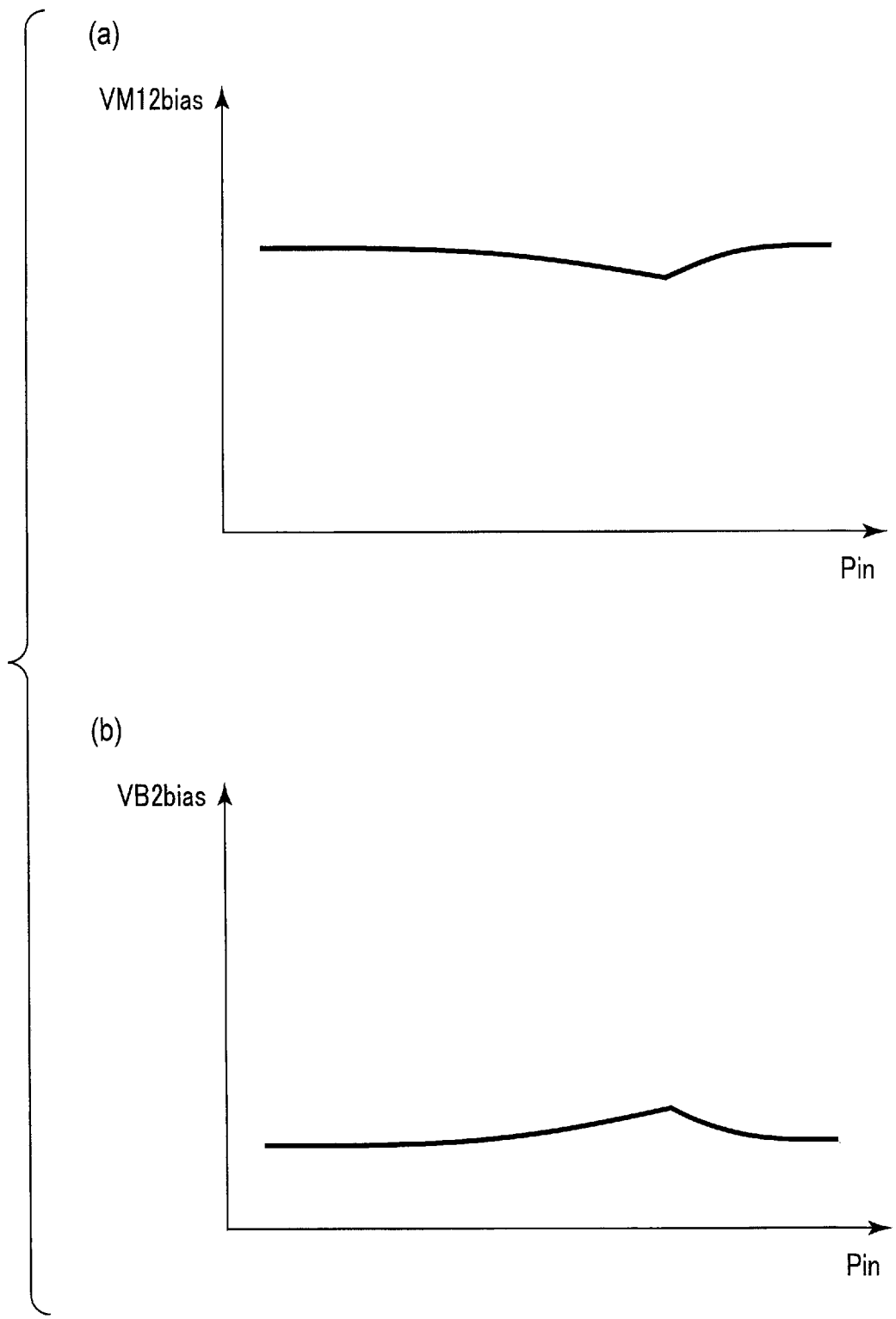
FIG. 8 is a figure including exemplary graphs representing relationships between the high-frequency power of the high-frequency signal and the bias voltages at respectively the first end of a transistor and the body of the transistor in response to a high-frequency signal input to the switch circuit according to the first embodiment.

(5) Relationship Between High-Frequency Power of Input High-Frequency Signal and Bias Voltages FIG. 8 is a diagram including exemplary graphs representing the relationships between the high-frequency power Pin of the high-frequency signal and the bias voltages at respectively the first end and body of the transistor M2 in response to a high-frequency signal input to the switch circuit 1 according to the first embodiment.

The graph (a) of FIG. 8 represents the relationship between the high-frequency power Pin and the bias voltage VM12bias at the first end of the transistor M2, where the horizontal axis indicates the value of the high-frequency power Pin, and the vertical axis indicates the value of the bias voltage VM12bias.

As described above with reference to FIGS. 4, 5, and 6, as the high-frequency power Pin increases, a larger leak current Ib is produced at the transistor M2, as a result of which the bias voltage VM12bias is lowered. As described above with reference to FIG. 7, as the high-frequency power Pin further increases, a current flows from the body of the transistor M2 to the node coupling the first end of the transistor M1 to the terminal IN, and also from the body to the node coupling the second end of the transistor M3 to the first end of the transistor M4. Similarly, the current flows into the first end and second end of the transistor M2. With the current flowing from the body of each transistor M, the bias voltage VM12bias is raised and suppressed from dropping.

The graph (b) of FIG. 8 represents the relationship between the high-frequency power Pin and the bias voltage VB2bias at the body of the transistor M2, where the horizontal axis indicates the value of the high-frequency power Pin, and the vertical axis indicates the value of the bias voltage VB2bias.

As described above with reference to FIGS. 4, 5, and 6, as the high-frequency power Pin increases, a larger leak current Ib is produced at the transistor M2, which raises the bias voltage VB2bias. As described above with reference to FIG. 7, as the high-frequency power Pin further increases, a current flows out of the body of the transistor M2. As a result, the bias voltage VB2bias is lowered, and its increase is suppressed.

(Effects)

The switch circuit 1 according to the first embodiment being in the OFF state will be described below. As the high-frequency power of the high-frequency signal input to the terminal IN increases, a leak current Ib is produced to flow from the drain or source to the body of each transistor M.

For instance, with a leak current Ib produced at the transistor M2, the bias voltage at the body of the transistor M2 may increase, and the bias voltages at the first end and second end of the transistor M2 may decrease, as described above with reference to FIG. 4. As a result of this, the potential difference between the body and drain of the transistor M2 is narrowed, which can easily turn the parasitic bipolar transistor between the drain and source of the transistor M2 to the ON state. With the parasitic bipolar transistor of a transistor M turned to the ON state, voltages applied to other transistors M are raised. This lowers the voltage withstanding property of the switch circuit 1.

As described above with reference to FIG. 2, the switch circuit 1 includes, as structural components of a feedback circuit, multiple transistors Tr corresponding to each of the transistors M. The transistors Tr corresponding to the transistor M2 will be described. The transistors Tr(2,1) and Tr(2,2) are serially coupled between the body of the transistor M2 and the first end of the transistor M1. The transistors Tr(2,3) and Tr(2,4) are serially coupled between the body of the transistor M2 and the second end of the transistor M3. As described above with reference to FIGS. 4 and 7, a current may flow from the body to the node coupling the first end of the transistor M1 to the terminal IN via the transistors Tr(2,1) and Tr(2,2), and from the body to the node coupling the second end of the transistor M3 to the first end of the transistor M4 via the transistors Tr(2,3) and Tr(2,4). The same holds for other transistors M.

With such current flows (hereinafter this may also be described as "with the feedback circuit being in operation"), even if a leak current Ib is produced at one transistor M, an increase in the bias voltage at the body of this transistor M can be suppressed, and a drop in the bias voltage at the first end and/or second end of the transistor M can also be suppressed. In this manner, the switch circuit 1 according to the first embodiment can prevent its high-voltage withstanding property from being lowered by the leak current Ib produced at the transistor M.

At time T10 in the example of FIG. 6, the transistor Tr(2,3) is in the OFF state even though the voltage VB2 at the body of the transistor M2 is higher than the voltage VR23. This is because the voltage VG2 at the gate of the transistor M2 coupled to the gate of the transistor Tr(2,3) is not high enough to turn the transistor Tr(2,3) to the ON state. Similarly, at time T11 in the example of FIG. 6 the transistor Tr(2,1) is in the OFF state even though the voltage VB2 at the body of the transistor M2 is higher than the voltage VR12.

In the example of FIG. 6, even if a leak current Ib is produced in response to a second high-frequency signal input to the terminal IN, the bias voltage at the bodies of the transistors M do not increase to a sufficiently high level to turn the parasitic bipolar transistors of the transistors M to the ON state, and the bias voltages at the first end and second end of the transistors M do not fall. In the switch circuit 1 according to the first embodiment, even if such a high-frequency signal is input to the terminal IN, the feedback circuit will not be in operation.

The switch circuit 1 according to the first embodiment, in which the gate of the transistor Tr(2,1) and the gate of the transistor Tr(2,3) that are coupled to the body of the transistor M2 instead of the gate of the transistor M2, will be considered now. That is, the structure in which the diode-connected transistor Tr(2,1) and diode-connected transistor Tr(2,3) are coupled to the body of the transistor M2 will be considered. If the voltages have the same levels as those at time T10 and the voltage VB2 is therefore sufficiently higher than the voltage VR23, a current flows from the body to the node coupling the second end of the transistor M3 to the first end of the transistor M4 via the transistors Tr(2,3) and Tr(2,4). If the voltages have the same levels as those at time T11 and the voltage VB2 is therefore sufficiently higher than the voltage VR12, a current flows from the body to the node coupling the first end of the transistor M1 to the terminal IN via the transistors Tr(2,1) and Tr(2,2). That is, in the switch circuit incorporating only diodes as structural components of the feedback circuit (hereinafter referred to as a "switch circuit according to the comparative example"), the feedback circuit may be in operation even when a high-frequency signal of a level that is not sufficient to bring the feedback circuit in the switch circuit 1 into operation is input to the terminal IN.

Figure 9:
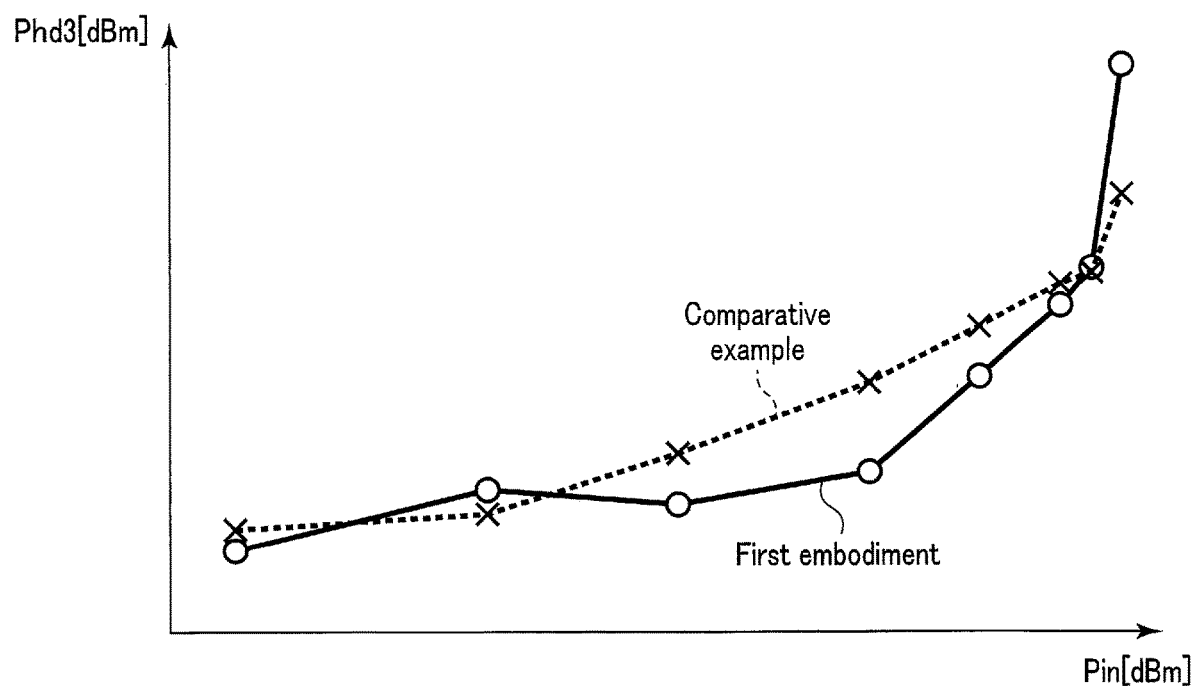
FIG. 9 is a figure including an exemplary graph representing a relationship between the high-frequency power of the high-frequency signal and the power of a third distortion generated under the influence of the feedback circuit in response to a high-frequency signal input to the switch circuit according to the first embodiment.

FIG. 9 is a diagram including an exemplary graph representing a relationship between the high-frequency power Pin of the high-frequency signal and the power Phd3 of the third distortion generated under the influence of the feedback circuit in response to a high-frequency signal input to the switch circuit 1 according to the first embodiment, where the horizontal axis indicates the value of the high-frequency power Pin, and the vertical axis indicates the value of the power Phd3. In this graph, the values for the high-frequency power Pin and power Phd3 are plotted in units of decibel milliwatts (dBmW). FIG. 9 also shows a graph for the switch circuit according to the comparative example.

The currents flowing out of the bodies of the transistors M in response to the feedback circuit brought into operation distort the linearity of the switch circuit 1. This may increase the power Phd3 of the third distortion generated in the switch circuit 1. As described above, the feedback circuit in the switch circuit according to the comparative example is brought into operation even if the amplitude of the high-frequency signal input to the terminal IN is still small, in comparison with the switch circuit 1 according to the first embodiment. For this reason, in the switch circuit according to the comparative example, the power Phd3 of the third distortion begins to increase when the high-frequency power Pin is still small in comparison with the switch circuit 1 according to the first embodiment, as a result of which the power Phd3 rapidly increases. In contrast, in the switch circuit 1 according to the first embodiment, it is when the high-frequency power Pin reaches a value sufficiently large to bring the feedback circuit into operation as shown in the example of FIG. 7 that the power Phd3 begins to increase. FIG. 9 illustrates the power Phd of the first embodiment as being larger than that of the comparative example when the power Pin further increases. A power Pin of such a level, however, is large enough to break the switch circuit 1 and therefore will not be adopted in actuality.

As discussed above, in the switch circuit 1 according to the first embodiment, the feedback circuit is not brought into operation if the parasitic bipolar transistor of each transistor M does not turn to the ON state in response to a leak current generated in the transistor M. This prevents the voltage withstanding property of the switch circuit 1 from deteriorating in the switch circuit 1 according to the first embodiment. In addition, it suppresses the deterioration of the linearity influenced by the feedback circuit.

Modification Examples

The configuration of the feedback circuit in the switch circuit 1 according to the first embodiment is not limited to the one illustrated in FIG. 2.

FIG. 10 is a diagram for explaining other examples of the circuitry configuration of the switch circuit 1 according to the first embodiment. In the following description, among a plurality of transistors Tr that constitute the feedback circuits described with reference to FIG. 2, the transistors Tr(3,3) and Tr(3,4) corresponding to the transistor M3 will be explained. FIG. 10 shows three examples, in each of which an additional transistor Tr is included as a structural component of the feedback circuit corresponding to the transistor M3 in the switch circuit 1. The same applies to other transistors Tr described with reference to FIG. 2.

In (a) of FIG. 10, the switch circuit 1 may include a transistor Tr(3,5) as a structural component of the feedback circuit corresponding to the transistor M3.

The transistor Tr(3,5) is coupled between the transistor Tr(3,4) and a node mutually coupling the resistor Rds(4,1) and resistor Rds(4,2). In particular, the second end of the transistor Tr(3,4) is coupled to the first end of the transistor Tr(3,5) and to the gate of the transistor Tr(3,5). That is, the diode-connected transistor Tr(3,5) is coupled to the second end of the transistor Tr(3,4). The second end of the transistor Tr(3,5) is coupled to the node mutually coupling the resistor Rds(4,1) and the resistor Rds(4,2).

In (b) of FIG. 10, the switch circuit 1 may include a transistor Tr(3,6) as a structural component of the feedback circuit corresponding to the transistor M3.

The transistor Tr(3,6) is coupled between the transistor Tr(3,4) and the node mutually coupling the resistor Rds(4,1) and resistor Rds(4,2). In particular, the transistor Tr(3,4) has the second end coupled to the first end of the transistor Tr(3,6), and the gate coupled to the gate of the transistor Tr(3,6). The second end of the transistor Tr(3,6) is coupled to the node mutually coupling the resistor Rds(4,1) and the resistor Rds(4,2).

In (c) of FIG. 10, the switch circuit 1 may include a transistor Tr(3,7) as a structural component of the feedback circuit corresponding to the transistor M3.

The transistor Tr(3,7) is coupled between the transistor Tr(3,3) and the transistor Tr(3,4). In particular, the transistor Tr(3,7) has the first end coupled to the second end of the transistor Tr(3,3), and the gate coupled to the gate of the transistor M3. The second end of the transistor Tr(3,7) is coupled to the first end of the transistor Tr(3,4) and to the gate of the transistor Tr(3,4).

Three examples have been described above in which three transistors Tr are coupled between the body of the transistor M3 and the node mutually coupling the resistor Rds(4,1) and resistor Rds(4,2). The number of transistors Tr coupled between the body and the node, however, is not limited to three, but may be four or more. If this is the case, the examples in (a), (b), and (c) of FIG. 10 may be suitably combined.

As indicated above, the number of transistors Tr and coupling pattern of these transistors between the body of the transistor M3 and the node mutually coupling the resistor Rds(4,1) and resistor Rds(4,2) may be suitably changed in consideration of a preferred voltage difference between the body and the node when a current flows from the body to the node, and/or in consideration of the voltage withstanding properties of the transistors Tr.

Second Embodiment

A switch circuit 1a according to the second embodiment will be described below.

The configuration, operation and effects of the switch circuit 1a according to the second embodiment will be described by mainly focusing on the differences with respect to the switch circuit 1 according to the first embodiment.

The description of the switch circuit 1 made with reference to FIG. 1 is applied to the switch circuit 1a. In particular, the switch circuit 1 can be replaced with the switch circuit 1a in the description of FIG. 1. The following description will focus on the switch circuit 1a.

Figure 11:
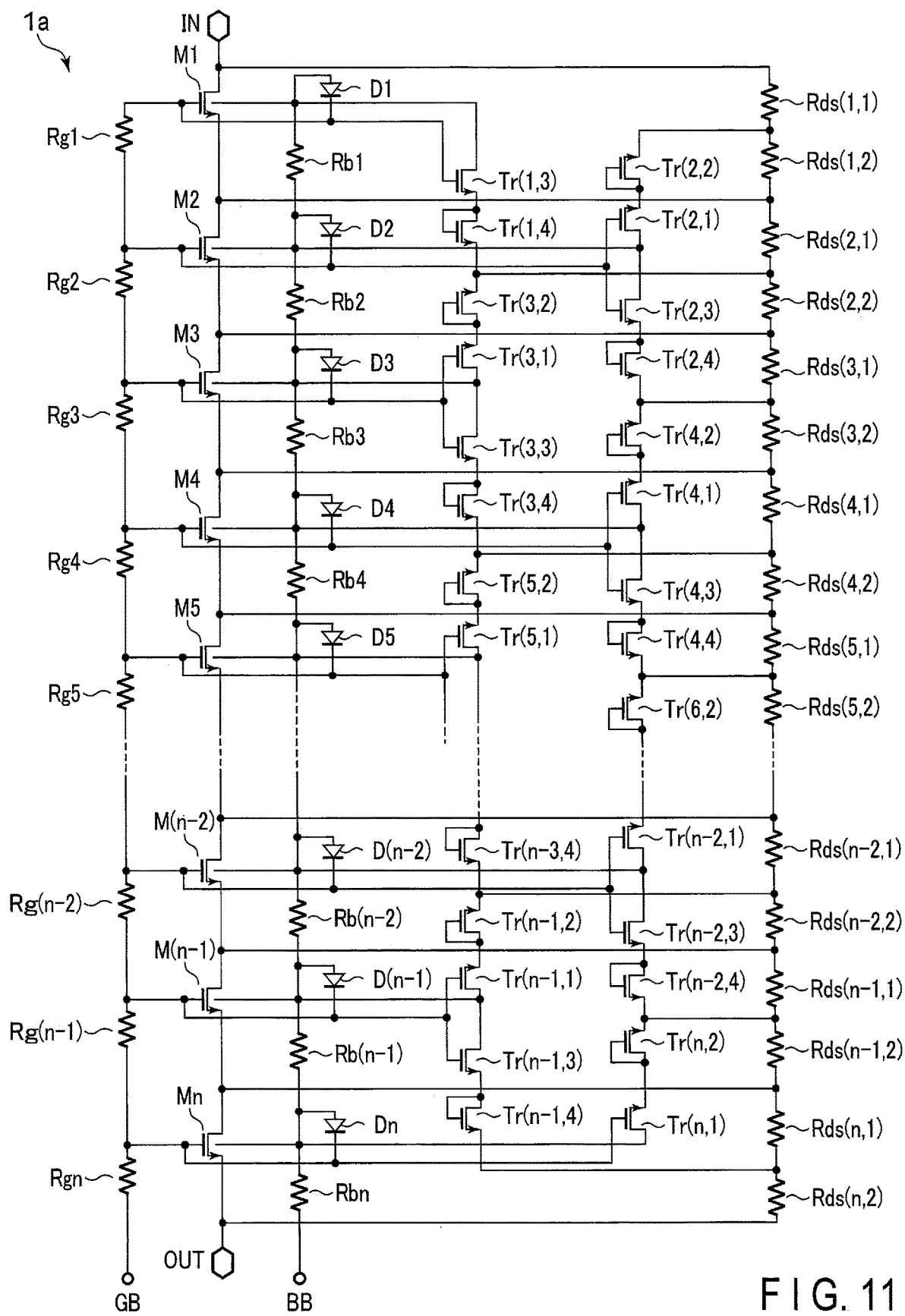
FIG. 11 is a diagram for showing an exemplary circuitry configuration of a switch circuit according to the second embodiment.

FIG. 11 shows an exemplary circuitry configuration of the switch circuit 1a according to the second embodiment.

In addition to the structural components of the switch circuit 1, the switch circuit 1a includes diodes D1, D2, D3, D4, D5, . . . , D(n−2), D(n−1), and Dn respectively constituted, for example, by PN junctions. In comparison with the circuitry configuration of FIG. 2 for the switch circuit 1, the switch circuit 1a has a circuitry configuration in which a diode D is coupled between the body and gate of each of the transistors M, i.e., transistors M1, M2, M3, . . . , and Mn. This configuration will be described in detail below.

The anode of the diode D1 is coupled to the body of the transistor M1, and the cathode of the diode D1 is coupled to the gate of the transistor M1. The anode of the diode D2 is coupled to the body of the transistor M2, and the cathode of the diode D2 is coupled to the gate of the transistor M2. The anode of the diode D3 is coupled to the body of the transistor M3, and the cathode of the diode D3 is coupled to the gate of the transistor M3. The same applies to the diodes D4, D5, . . . , D(n−2), D(n−1), and Dn.

For instance, with the voltage at the body of the transistor M2 being higher than the voltage at the gate of the transistor M2, a current flows from the body to the gate via the diode D2. With such a current flow, the voltage of the body falls. The same applies to other diodes D. The current that flows via the diodes D may contribute to the suppression of an increase in the bias voltage at the body of the transistor M. These diodes D are effectively brought into operation particularly when the voltage of the signal BB is equal to or higher than the voltage of the signal GB.

In the above description, diodes of PN junctions such as diodes D1, D2, D3, D4, D5, . . . , D(n−2), D(n−1), and Dn are adopted as the structural components of the switch circuit 1a. In place of such diodes D, diode-connected transistors may be used in the switch circuit 1a.

Third Embodiment

A switch circuit 1b according to the third embodiment will be described below.

The configuration, operation and effects of the switch circuit 1b according to the third embodiment will be described by mainly focusing on the differences with respect to the switch circuit 1 according to the first embodiment.

The description of the switch circuit 1 made with reference to FIG. 1 is applied to the switch circuit 1b. In particular, the switch circuit 1 is replaced with the switch circuit 1b in the description of FIG. 1. The following description will focus on the switch circuit 1b.

Figure 12:
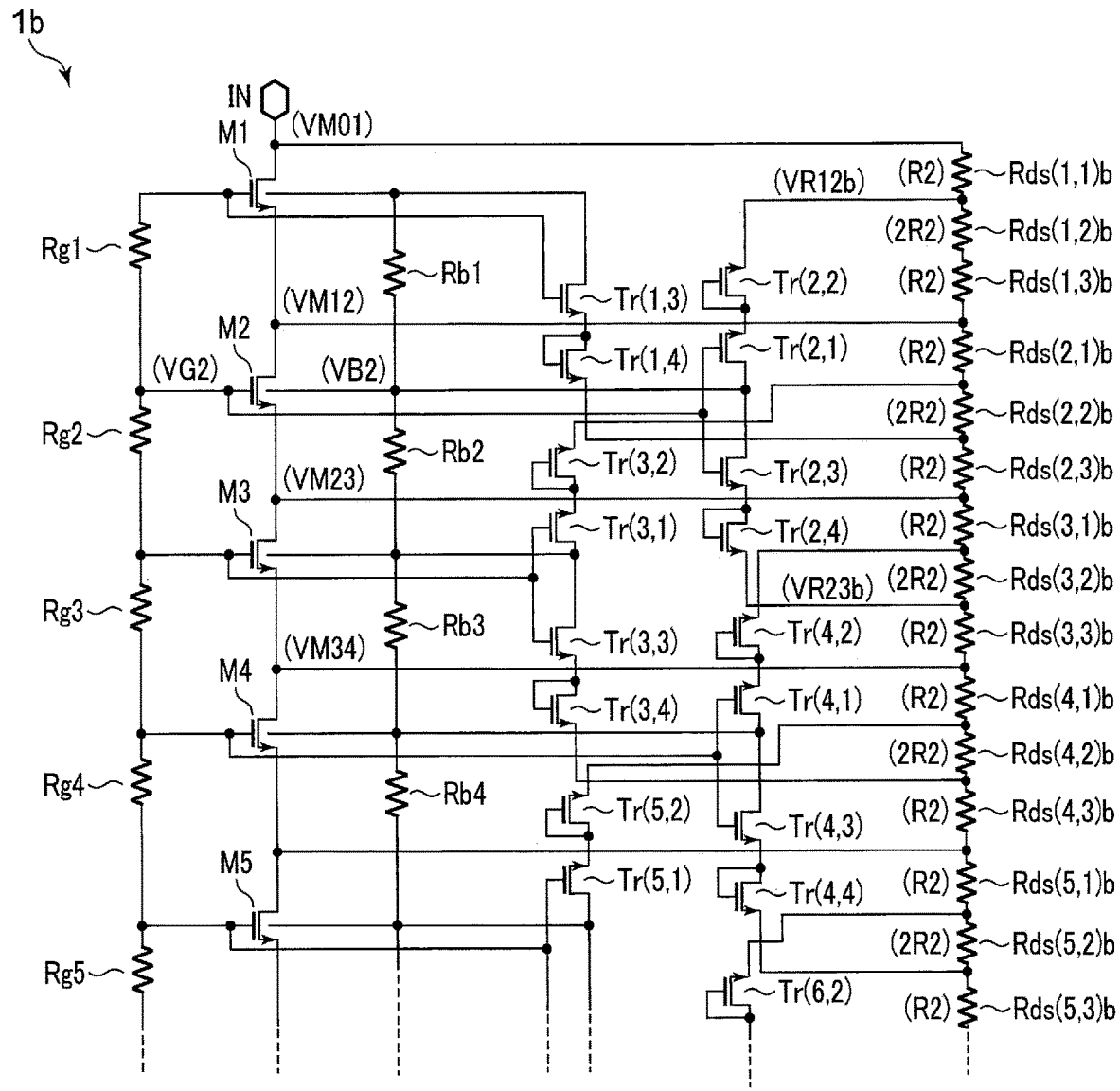
FIG. 12 is a diagram showing an exemplary circuitry configuration of a switch circuit according to the third embodiment.

FIG. 12 shows an exemplary circuitry configuration of the switch circuit 1b according to the third embodiment.

In comparison with the circuitry configuration of FIG. 2 for the switch circuit 1, the switch circuit 1b has a circuitry configuration in which the resistor between the first end and second end of each of the transistors M, i.e., each of the transistors M1, M2, M3, . . . , and Mn, is replaced as described below. The following holds when the integer i is any integer between 1 to n.

The resistors Rds(i,1) and Rds(i,2) between the first end and second end of a transistor Mi are replaced with resistors Rds(i,1)b, Rds(i,2)b, and Rds(i,3)b. In particular, the first end of the transistor Mi is coupled to one end of the resistor Rds(i,1)b, the other end of the resistor Rds(i,1)b is coupled to one end of the resistor Rds(i,2)b, the other end of the resistor Rds(i,2)b is coupled to one end of the resistor Rds(i,3)b, and the other end of the resistor Rds(i,3)b is coupled to the second end of the transistor Mi.

In the case of the integer i being any of 1 to n, the resistance values of the resistor Rds(i,1)b and resistor Rds(i,3)b are both substantially R2, for example. The resistance value of the resistor Rds(i,2)b is two times larger than the value of R2, for example. It is assumed below that the resistance values of the resistor Rds(i,1)b and resistor Rds(i,3)b are both substantially R2, and that the resistance value of the resistor Rds(i,2)b is two times larger than the value of R2 for any integer i from 1 to n.

The coupling relationship of the transistors Tr corresponding to each of the transistors M as the structural components of the feedback circuit will be described now, focusing on the differences with respect to the switch circuit 1 according to the first embodiment.

The second end of the transistor Tr(1,4) corresponding to the transistor M1 is coupled to a node mutually coupling the resistor Rds(2,2)b and resistor Rds(2,3)b.

The following description is applied to the transistors Tr corresponding to the transistors M2, M3, . . . , and M(n−1) for the integer j being any integer from 2 to n−1.

The second end of the transistor Tr(j,2) is coupled to the node mutually coupling the resistor Rds(j−1,1)b and resistor Rds(j−1,2)b. The second end of the transistor Tr(j,4) is coupled to the node mutually coupling the resistor Rds(j+1,2)b and resistor Rds(j+1,3)b.

The second end of the transistor Tr(n,2) corresponding to the transistor Mn is coupled to a node mutually coupling the resistor Rds(n−1,1)b and resistor Rds(n−1,2)b.

The voltages VM01, VM12, VM23, VM34, VG2, VB2, VRl2b, and VR23b indicated in FIG. 12 will be referred to in the following description.

The voltage VR12b represents the voltage of the node coupling the second end of the transistor Tr(2,2), the resistor Rds(1,1)b, and the resistor Rds(1,2)b to one another. The voltage VR23b represents the voltage of the node coupling the second end of the transistor Tr(2,4), the resistor Rds(3,2)b, and the resistor Rds(3,3)b to one another.

Figure 13:
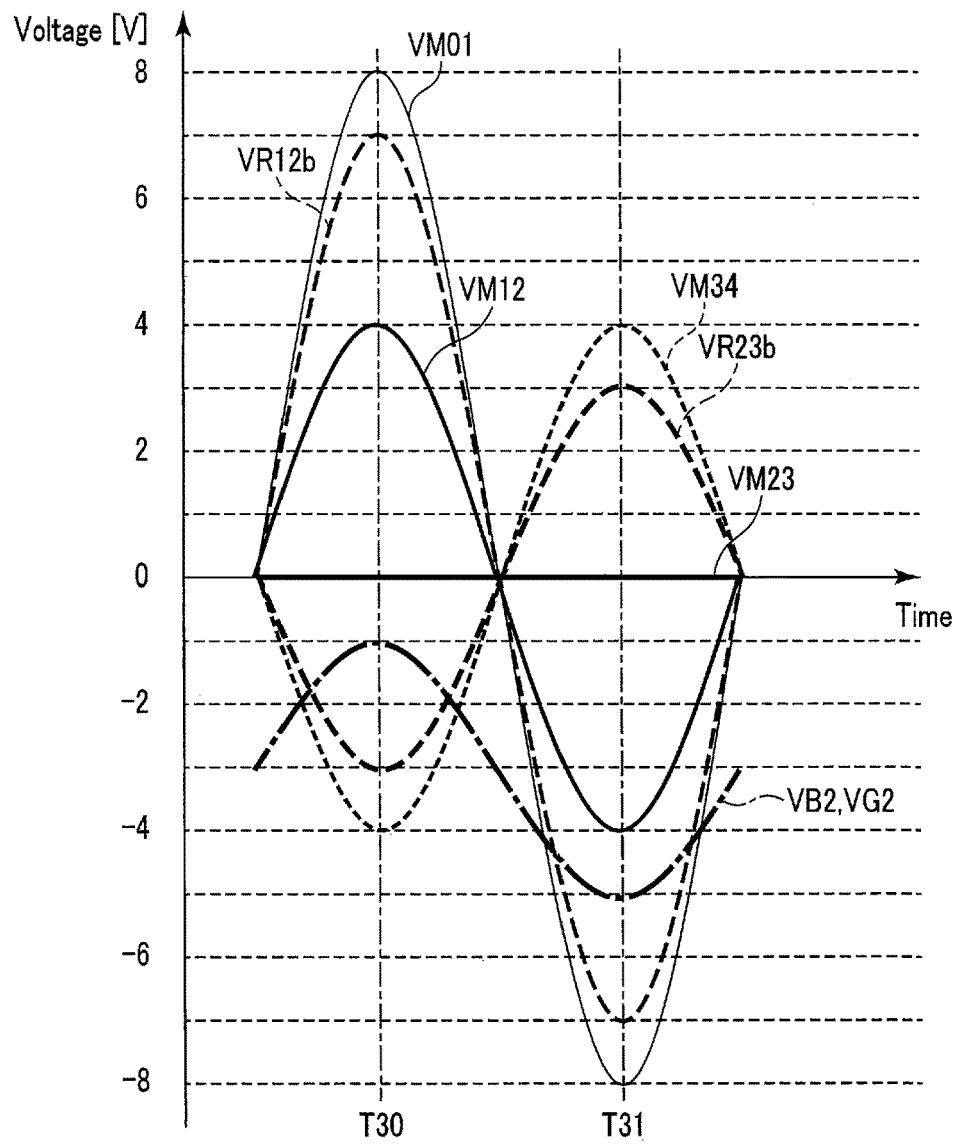
FIG. 13 is a diagram for explaining the operation of the switch circuit according to the third embodiment in response to a third high-frequency signal input to the switch circuit.
Figure 13:
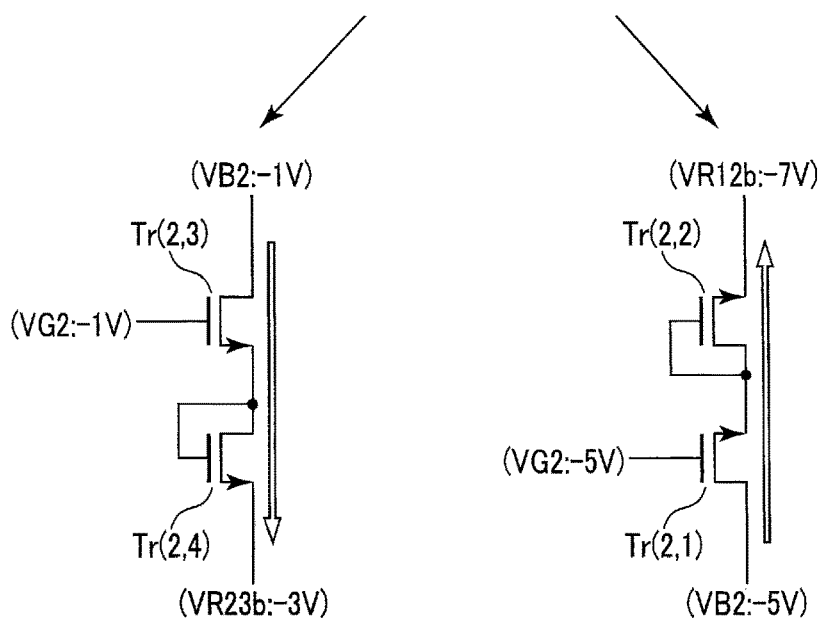

FIG. 13 is a diagram for explaining the operation of the switch circuit 1b according to the third embodiment when a third high-frequency signal is input to the switch circuit 1b. Exemplary waveforms of the voltages VM01, VM12, VM23, VM34, VG2, VB2, VR12b, and VR23b in response to the third high-frequency signal input to the terminal IN are plotted in FIG. 13, where the horizontal axis indicates time, and the vertical axis indicates the voltage value.

In response to the third high-frequency signal input to terminal IN, the signal of the voltage applied between the first end and second end of each transistor M is a high-frequency signal of 4 V, in the same manner as in FIG. 7. It is assumed here that the voltage of the signal GB is −3 V at the L level, and that the voltage of the signal BB is also −3 V in the same manner as in FIG. 7. Under these conditions, the waveforms of the voltages VM01, VM12, VM23, VM34, VG2, and VB2 are the same as in the example of FIG. 7.

The signal of the voltage VR12b is a high-frequency signal of 7 V. This is based on the voltage division by the resistor Rds(1,1)b and the resistors Rds(1,2)b and Rds(1,3)b. Similarly, the signal of the voltage VR23b is a high-frequency signal of 3 V. The signal of the voltage VR12b is substantially in the same phase as the signal of the voltage VM12, and the signal of the voltage VR23b is substantially in the opposite phase with respect to the signal of the voltage VM12.

Times T30 and T31 will be described. At time T30, the voltage VM12 reaches its maximum value, and at time T31, the voltage VM12 falls to its minimum value.

At time T30, the voltage VB2 and voltage VG2 are −1 V in the same manner as at time T20 in the example of FIG. 7; however, the voltage VR23b is −3 V, which is lower than the voltage VR23 of −2 V at time T20 in the example of FIG. 7. In the same manner as at time T20 in the example of FIG. 7, a current flows out of the body of the transistor M2 via the transistor Tr(2,3) and transistor Tr(2,4); however, in comparison with the time T20 in FIG. 7, the voltage at the source of the transistor Tr(2,4) is lower.

At time T31, the voltage VB2 and voltage VG2 are −5 V in the same manner as at time T21 in the example of FIG. 7; however, the voltage VR12b is −7 V, which is lower than the voltage VR12 of −6 V at time T21 in the example of FIG. 7. In the same manner as at time T21 in the example of FIG. 7, a current flows out of the body of the transistor M2 via the transistor Tr(2,1) and transistor Tr(2,2); however, in comparison with the time T21 in FIG. 7, the voltage at the source of the transistor Tr(2,2) is lower.

The voltage at the sources of the transistors Tr(2,2) and Tr(2,4) being low in the switch circuit 1b of FIG. 12 indicates that the feedback circuit may be operated even if the high-frequency signal input to the terminal IN has a small amplitude in comparison with the switch circuit 1 of FIG. 2.

In the above description, the resistance between the first end of the transistor M1 and the second end of the transistor Tr(2,2) is R2, and the resistance between the second end of the transistor Tr(2,2) and the second end of the transistor M1 is three times larger than the value of R2. The present embodiment, however, is not limited thereto. The ratio of the resistance between the first end of the transistor M1 and the second end of the transistor Tr(2,2) to the resistance between the second end of the transistor Tr(2,2) and the second end of the transistor M1 may take a different value. For instance, the resistance between the first end of the transistor M1 and the second end of the transistor Tr(2,2) may be one third to three times larger than the resistance between the second end of the transistor Tr(2,2) and the second end of the transistor M1. The same applies to other transistors Tr(1,4), Tr(2,4), Tr(3,2), Tr(3,4), . . . , Tr(n−1,2), Tr(n−1,4), and Tr(n,2).

As described above, the switch circuit 1b according to the third embodiment can adjust whether or not to operate the feedback circuit in accordance with the high-frequency power of a high-frequency signal input to the terminal IN.

Fourth Embodiment

The switch circuit 1c according to the fourth embodiment will be described below.

The configuration, operation and effects of the switch circuit 1c according to the fourth embodiment will be described by mainly focusing on the differences with respect to the switch circuit 1 according to the first embodiment.

The description of the switch circuit 1 made with reference to FIG. 1 is applied to the switch circuit 1c. In particular, the switch circuit 1 is replaced with the switch circuit 1c in the description of FIG. 1. The following description will focus on the switch circuit 1c.

FIG. 14 shows an exemplary circuitry configuration of the switch circuit 1c according to the fourth embodiment.

In addition to the configuration of the switch circuit 1, the switch circuit 1c further includes transistors Tr(1,1), Tr(1,2), Tr(n,3), and Tr(n,4) as structural components of the feedback circuit. In comparison with the circuitry configuration of FIG. 2 for the switch circuit 1, the switch circuit 1c has a circuitry configuration in which the transistors Tr(1,1), Tr(1,2), Tr(n,3), and Tr(n,4) are coupled as indicated below.

The transistors Tr(1,1) and Tr(1,2) correspond to the transistor M1.

The first end of the transistor Tr(1,1) is coupled to the body of the transistor M1, and the gate of the transistor Tr(1,1) is coupled to the gate of the transistor M1. The second end of the transistor Tr(1,1) is coupled to the first end of the transistor Tr(1,2) and to the gate of the transistor Tr(1,2). That is, the second end of the transistor Tr(1,1) is coupled to the diode-connected transistor Tr(1,2). The second end of the transistor Tr(1,2) is coupled to a node mutually coupling the resistor Rds(2,1) and the resistor Rds(2,2).

The transistors Tr(n,3) and Tr(n,4) correspond to the transistor Mn.

The first end of the transistor Tr(n,3) is coupled to the body of the transistor Mn, and the gate of the transistor Tr(n,3) is coupled to the gate of the transistor Mn. The second end of the transistor Tr(n,3) is coupled to the first end of the transistor Tr(n,4) and to the gate of the transistor Tr(n,4). In this manner, the second end of the transistor Tr(n,3) is coupled to the diode-connected transistor Tr(n,4). The second end of the transistor Tr(n,4) is coupled to a node mutually coupling the resistor Rds(n−1,1) and the resistor Rds(n−1,2).

In the same manner as in FIG. 2, a current flows from the body of the transistor M1 via the transistors Tr(1,1) and Tr(1,2). Such a current flow can suppress an increase in the bias voltage at the body of the transistor M1, which tends to be increased by the leak current Ib generated in the transistor M1. Similarly, a current may flow from the body of the transistor Mn via the transistors Tr(n,3) and Tr(n,4). This current flow may also contribute to the suppression of an increase in the bias voltage at the body of the transistor Mn that tends to be caused by the leak current Ib generated in the transistor Mn.

Fifth Embodiment

The switch circuit 1d according to the fifth embodiment will be described below.

The configuration, operation and effects of the switch circuit 1d according to the fifth embodiment will be described by mainly focusing on the differences with respect to the switch circuit 1a according to the second embodiment.

The description of the switch circuit 1 made with reference to FIG. 1 is applied to the switch circuit 1d. In particular, the switch circuit 1 is replaced with the switch circuit 1d in the description of FIG. 1. The switch circuit 1d will be described below.

FIG. 15 shows an exemplary circuitry configuration of the switch circuit 1d according to the fifth embodiment.

With respect to the circuitry configuration of the switch circuit 1a, the resistors Rb1, Rb2, Rb3, Rb4 . . . , Rb(n-2), Rb(n-1), and Rbn are omitted in the circuitry configuration of the switch circuit 1d. This configuration will be described in detail below.

No resistor formed of polysilicon is provided between the body of the transistor M1 and the body of the transistor M2. No resistor formed of polysilicon is provided between the body of the transistor M2 and the body of the transistor M3. No resistor formed of polysilicon is provided between the body of the transistor M3 and the body of the transistor M4. The same applies to the positions between the body of the transistor M4 and the body of the transistor M5, . . . , between the body of the transistor M(n-2) and the body of the transistor M(n-1), and between the body of the transistor M(n-1) and the transistor Mn. Furthermore, no signal BB is input to the switch circuit 1d.

As described above, the switch circuit 1d does not include any terminal or resistor for externally applying a voltage to the body of a transistor. As a result, a parasitic capacitance can be suppressed, and an insertion loss, which is a loss produced when a signal passes through the switch circuit 1d of the ON state, can be suppressed.

Sixth Embodiment

A switch circuit 1e according to the sixth embodiment will be described below.

The configuration, operation and effects of the switch circuit 1e according to the sixth embodiment will be described by mainly focusing on the differences with respect to the switch circuit 1d according to the fifth embodiment.

The description of the switch circuit 1 made with reference to FIG. 1 is applied to the switch circuit 1e. In particular, the switch circuit 1 is replaced with the switch circuit 1e in the description of FIG. 1. The switch circuit 1e will be described below.

Figure 16:
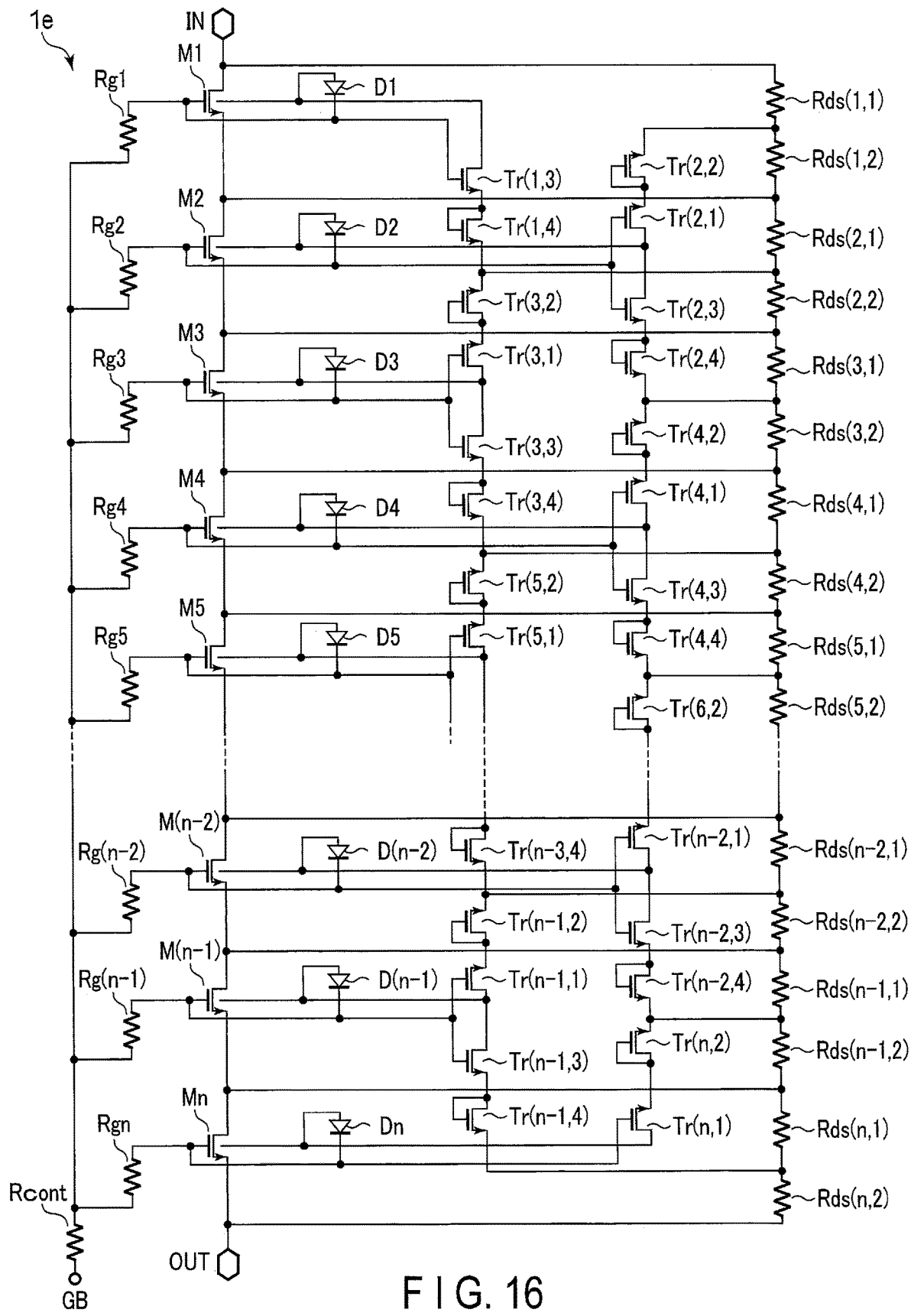
FIG. 16 is a diagram for showing an exemplary circuitry configuration of a switch circuit according to the sixth embodiment.

FIG. 16 shows an exemplary circuitry configuration of the switch circuit 1e according to the sixth embodiment.

In addition to the configuration of the switch circuit 1d, the configuration of the switch circuit 1e further includes a resistor Rcont, where the coupling of the resistors Rg1, Rg2, Rg3, Rg4, Rg5, . . . , Rg(n-2), Rg(n-1), and Rgn are changed. This configuration will be described in detail below.

The gate of the transistor M1 is coupled to one end of the resistor Rg1. The other end of the resistor Rg1 is coupled to one end of the resistor Rcont. The gate of the transistor M2 is coupled to one end of the resistor Rg2. The other end of the resistor Rg2 is coupled to one end of the resistor Rcont. The gate of the transistor M3 is coupled to one end of the resistor Rg3. The other end of the resistor Rg3 is coupled to one end of the resistor Rcont. The same applies to the coupling relationship of the remaining resistors Rg4, Rg5, . . . , Rg(n-1), and Rgn. The other end of the resistor Rcont is coupled to a node through which a signal GB is input. In FIG. 16, the control end through which the signal GB is input to the switch circuit 1e is illustrated.

Even if the coupling of the resistors Rg1, Rg2, Rg3, . . . , Rg(n-1), and Rgn is changed as indicted above, the switch circuit 1e according to the sixth embodiment can suppress insertion loss in the same manner as in the switch circuit 1d according to the fifth embodiment.

Other Embodiments

Throughout the specification, "coupling" refers to electrical connection. This coupling may include coupling with another element interposed. The "resistance" mentioned in the specification may be a resistive element or a parasitic resistance.

Throughout the specification, expressions such as "the same" "corresponding", "constant" and "maintaining" are used on the assumption that there may be deviations within the scope of design at the time of embodying the techniques described in the embodiments. The same applies to the expressions accompanied with "substantially" such as "substantially the same". The expressions "supply a voltage" or "apply a voltage" are used with the intention of including both controlling the application or supply of a voltage, and actually applying or supplying the voltage. In addition, applying or supplying a voltage may include applying or supplying a voltage of 0 V.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalences are intended to cover such forms or modifications as would fall within the scope and spirit of the inventions.

What is claimed is:
1. A semiconductor device comprising an input terminal, an output terminal, and a plurality of transistors coupled through serial coupling between the input terminal and the output terminal, wherein
the transistors include:
a first transistor having a first end and a second end that are used for the serial coupling; and
a second transistor having a third end, a fourth end, a first gate, and a first body, the third end and the fourth end being used for the serial coupling, the third end being coupled to the second end,
the semiconductor device further comprises a third transistor and a first diode serially coupled between the first body and the first end,
the third transistor includes a second gate coupled to the first gate and not coupled to the first body, the third transistor not being diode-connected,
an anode of the first diode is arranged on a side of the first body between the first body and the first end, and a cathode of the first diode is arranged on a side of the first end between the first body and the first end, and
whether the third transistor is in an ON state or in an OFF state depends on a voltage of the first gate.

2. The semiconductor device according to claim 1, further comprising:
a first resistor and a second resistor serially coupled between the first end and the second end,
wherein the third transistor and the first diode are serially coupled between the first body and a node coupling the first resistor and the second resistor.

3. The semiconductor device according to claim 2, wherein
a fourth transistor is used as the first diode,
the third transistor includes a fifth end coupled to the first body, and a sixth end, and
the fourth transistor includes a seventh end coupled to the sixth end, an eighth end coupled to a node coupling the first resistor and the second resistor, and a third gate coupled to the seventh end.

4. The semiconductor device according to claim 1, wherein
the transistors further include a fifth transistor having a ninth end and a tenth end that are used for the serial coupling, the ninth end being coupled to the fourth end,
the semiconductor device further comprises a sixth transistor and a second diode serially coupled between the first body and the tenth end,
the sixth transistor includes a fourth gate coupled to the first gate, and
an anode of the second diode is arranged on a side of the first body between the first body and the tenth end, and a cathode of the second diode is arranged on a side of the tenth end between the first body and the tenth end.

5. The semiconductor device according to claim 2, wherein
the transistors further include a fourth transistor having a fifth end and a sixth end that are used for the serial coupling, the fifth end being coupled to the fourth end,
the semiconductor device further comprises a fifth transistor and a second diode serially coupled between the first body and the sixth end,
the fifth transistor includes a third gate coupled to the first gate,
an anode of the second diode is arranged on a side of the first body between the first body and the sixth end, and a cathode of the second diode is arranged on a side of the sixth end between the first body and the sixth end,
the semiconductor device further comprises a third resistor and a fourth resistor serially coupled between the fifth end and the sixth end,
the fifth transistor and the second diode are serially coupled between the first body and a node coupling the third resistor and the fourth resistor,
the first end is coupled to one end of the first resistor, the other end of the first resistor is coupled to one of the second resistor, and the other end of the second resistor is coupled to the second end,
the fifth end is coupled to one end of the third resistor, the other end of the third resistor is coupled to one end of the fourth resistor, and the other end of the fourth resistor is coupled to the sixth end, and
the first resistor and the fourth resistor have a same resistance value, and the second resistor and the third resistor have a same resistance value.

6. The semiconductor device according to claim 1, further comprising:
a fifth transistor and a second diode serially coupled between the first body and the first end, wherein
the fifth transistor and the second diode are coupled between the first body and the first end in parallel with the third transistor and the first diode,
the fifth transistor includes a fourth gate coupled to the first gate, and
an anode of the second diode is arranged on a side of the first body between the first body and the first end, and a cathode of the second diode is arranged on a side of the first end between the first body and the first end.

7. The semiconductor device according to claim 1, further comprising:
one or more diodes serially coupled to the third transistor and the first diode between the first body and the first end.

8. The semiconductor device according to claim 1, further comprising:
a third diode having an anode coupled to the first body and a cathode coupled to the first gate.

9. The semiconductor device according to claim 4, further comprising:
a first resistor and a second resistor serially coupled between the first end and the second end, a third resistor and a fourth resistor serially coupled between the third end and the fourth end, and a fifth resistor and a sixth resistor serially coupled between the ninth end and the tenth end,
wherein the third transistor and the first diode are serially coupled between the first body and a node coupling the first resistor and the second resistor, and
the sixth transistor and the second diode are serially coupled between the first body and a node coupling the fifth resistor and the sixth resistor.

10. The semiconductor device according to claim 9, wherein
the first resistor, the second resistor, the third resistor, the fourth resistor, the fifth resistor, and the sixth resistor have identical resistance values.

11. The semiconductor device according to claim 9, wherein
the first transistor further includes a fifth gate and a second body,
the semiconductor device further comprises a seventh transistor and a third diode serially coupled between the second body and a node coupling the third resistor and the fourth resistor,
the seventh transistor includes a sixth gate coupled to the fifth gate, and
an anode of the third diode is arranged on a side of the second body between the second body and the node coupling the third resistor and the fourth resistor, and a cathode of the third diode is arranged on a side of the node coupling the third resistor and the fourth resistor between the second body and the node coupling the third resistor and the fourth resistor.

12. The semiconductor device according to claim 9, wherein
the fifth transistor further includes a seventh gate and a third body,
the semiconductor device further comprises an eighth transistor and a fourth diode serially coupled between the third body and a node coupling the third resistor and the fourth resistor,
the eighth transistor includes an eighth gate coupled to the seventh gate, and an anode of the fourth diode is arranged on a side of the third body between the third body and a node coupling the third resistor and the fourth resistor, and a cathode of the fourth diode is arranged on a side of the node coupling the third resistor and the fourth resistor between the third body and the node coupling the third resistor and the fourth resistor.

13. The semiconductor device according to claim 1, wherein the first transistor includes a second body, and a seventh resistor formed of polysilicon is arranged to couple the first body and the second body.

14. The semiconductor device according to claim 1, wherein the first transistor includes a second body, and a resistor formed of polysilicon is not arranged to couple the first body and the second body.

* * * * *